(12) United States Patent
Yamaki

(10) Patent No.: US 9,557,790 B2
(45) Date of Patent: Jan. 31, 2017

(54) SEMICONDUCTOR DEVICE

(71) Applicant: RENESAS ELECTRONICS CORPORATION, Tokyo (JP)

(72) Inventor: Takashi Yamaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/015,643

(22) Filed: Feb. 4, 2016

(65) Prior Publication Data
US 2016/0154447 A1 Jun. 2, 2016

Related U.S. Application Data

(63) Continuation of application No. 13/532,107, filed on Jun. 25, 2012, now Pat. No. 9,269,408.

(30) Foreign Application Priority Data

Jul. 21, 2011 (JP) .................................. 2011-159804

(51) Int. Cl.
*G11C 5/02* (2006.01)
*G06F 1/26* (2006.01)
(Continued)

(52) U.S. Cl.
CPC ............... *G06F 1/26* (2013.01); *G06F 3/0604* (2013.01); *G06F 3/067* (2013.01); *G06F 3/0629* (2013.01);
(Continued)

(58) Field of Classification Search
None
See application file for complete search history.

(56) References Cited

U.S. PATENT DOCUMENTS

| 5,325,336 A | 6/1994 | Tomishima et al. |
| 5,724,297 A | 3/1998 | Noda et al. |
(Continued)

FOREIGN PATENT DOCUMENTS

| CN | 1725372 A | 1/2006 |
| JP | 39-231756 A | 9/1997 |
(Continued)

OTHER PUBLICATIONS

Extended European Search Report received in corresponding European Application No. 12172625.1 dated Jun. 8, 2015.
(Continued)

*Primary Examiner* — Son Dinh
*Assistant Examiner* — Uyen B Tran
(74) *Attorney, Agent, or Firm* — Mattingly & Malur, PC

(57) ABSTRACT

In a semiconductor device, memory modules each having a low power consumption mode that is enabled and disabled by a control signal belong to a memory block. A transmission path of the control signal is provided such that the control signal is inputted in parallel to the memory module via an inside-of-module path, and such that the control signal is outputted by a particular memory module of the memory modules via the inside-of-module path to a downstream outside-of-module path. The particular memory module in the memory block is selected such that it has a greater storage capacity than the other memory modules belonging to this same memory block have.

27 Claims, 15 Drawing Sheets

(51) Int. Cl.
*G11C 5/14* (2006.01)
*G11C 7/22* (2006.01)
*G11C 11/413* (2006.01)
*G06F 3/06* (2006.01)
*G11C 11/417* (2006.01)

(52) U.S. Cl.
CPC ............... *G11C 5/148* (2013.01); *G11C 7/22* (2013.01); *G11C 11/413* (2013.01); *G11C 11/417* (2013.01); *G11C 2207/2227* (2013.01)

(56) References Cited

U.S. PATENT DOCUMENTS

| | | | |
|---|---|---|---|
| 6,314,044 B1 | 11/2001 | Sasaki et al. | |
| 6,363,008 B1 | 3/2002 | Wong | |
| 7,633,315 B2 | 12/2009 | Yamaoka et al. | |
| 8,572,311 B1 | 10/2013 | Shalvi et al. | |
| 8,726,064 B2 * | 5/2014 | Bennett | G06F 13/1684 710/100 |
| 2001/0014930 A1 | 8/2001 | Soderquist | |
| 2001/0026487 A1 | 10/2001 | Koga | |
| 2005/0286322 A1 | 12/2005 | Choi et al. | |
| 2006/0123755 A1 * | 6/2006 | Schuster | A01D 31/00 56/1 |
| 2006/0291263 A1 * | 12/2006 | Wallner | G11O 5/063 365/63 |
| 2007/0279084 A1 | 12/2007 | Oh et al. | |
| 2009/0237971 A1 | 9/2009 | Chung et al. | |
| 2009/0273960 A1 * | 11/2009 | Kim | G11C 7/1048 365/51 |
| 2010/0188922 A1 | 7/2010 | Nakaoka | |
| 2010/0220510 A1 | 9/2010 | Shalvi | |
| 2010/0328983 A1 | 12/2010 | Cheng | |
| 2012/0030396 A1 | 2/2012 | Zhu et al. | |

FOREIGN PATENT DOCUMENTS

| | | | | |
|---|---|---|---|---|
| JP | 2007-164822 | * | 6/2007 | ............... G11C 5/14 |
| JP | 2007-164822 A | | 6/2007 | |
| JP | 2007-173385 A | | 7/2007 | |
| JP | 2008-91030 A | | 4/2008 | |

OTHER PUBLICATIONS

Chinese Office Action received in corresponding Chinese Application No. 201210249451.X dated Apr. 26, 2016.

Taiwanese Office Action received in corresponding Taiwanese Application No. 10520731750 dated Jun. 15, 2016.

* cited by examiner

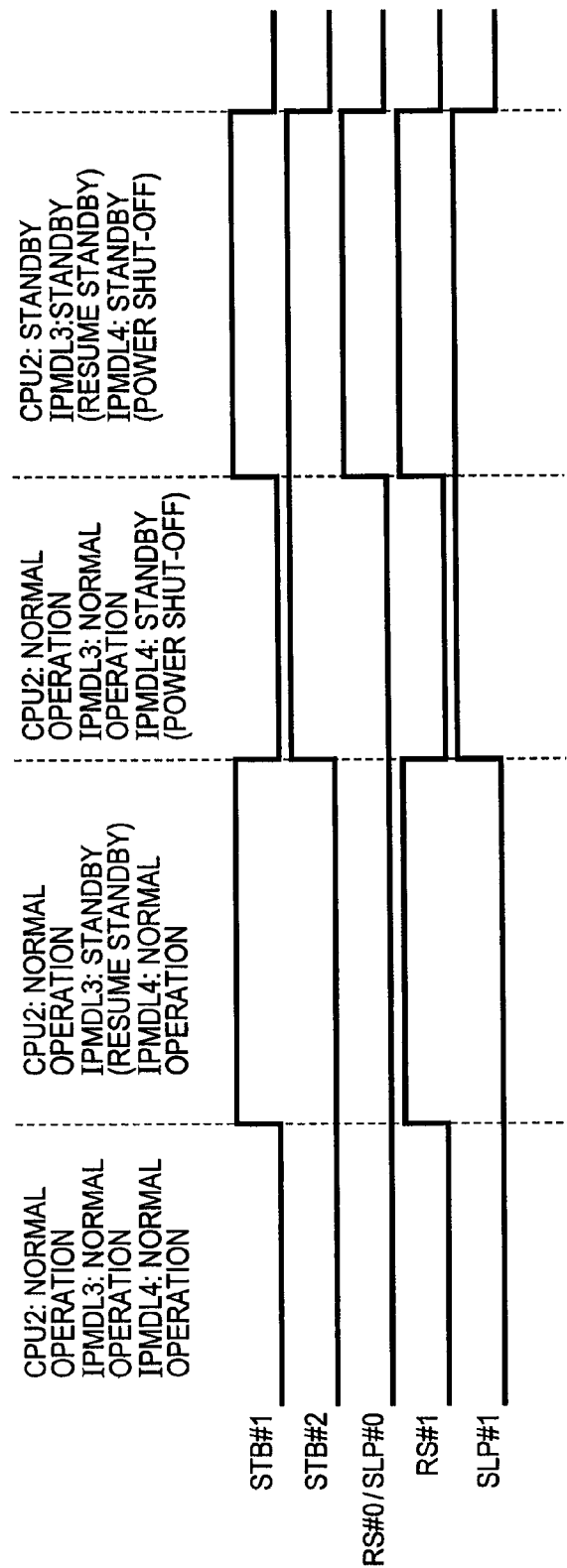

SEMICONDUCTOR DEVICE

CROSS-REFERENCE TO RELATED APPLICATIONS

This application is a continuation application of Ser. No. 13/532,107, filed Jun. 25, 2012, which the disclosure of Japanese Patent Application No. 2011-159804 filed on Jul. 21, 2011 including the specification, drawings and abstract is incorporated herein by reference in its entirety.

BACKGROUND

The present invention relates to a semiconductor device including a plurality of memory modules having a low power consumption mode, which is suitable for use, for example, in a system-on-chip microcomputer including a plurality of memory modules as well as a central processing unit, an accelerator, etc.

When the semiconductor device is in the low power consumption mode, if the low power consumption mode is cancelled, supplying of electric power is restarted to a circuit to which no electric power is supplied in the low power consumption mode and a circuit in a non-operating state restarts operation. As a result, an inrush current and an undesirable increase in ground level can occur. This can cause electromigration to occur, which can in turn cause a failure to occur. Besides, a fluctuation in a logical threshold level can occur, which can cause an error to occur in operation. In particular, in a case where the memory modules installed in the semiconductor device have a large storage capacity, a large inrush current can occur when the lower power consumption state is cancelled for many memory modules. Thus there is a need for a technique to reduce an inrush current that occurs when the low power consumption mode is cancelled, and some techniques are disclosed in patent documents, typical examples of which are described below.

Japanese Unexamined Patent Publication No. 2007-164822 discloses a technique in which a plurality of semiconductor chips are coupled in a daisy chain form to each other using signal lines (bonding wires), and a power-on control signal is transmitted via the signal lines to thereby control timing of turning on electric power of the semiconductor chips such that the semiconductor chips are not turned on simultaneously but sequentially thereby preventing a high current peak from occurring during a turn-on operation.

Japanese Unexamined Patent Publication No. 2008-91030 discloses a technique in which a semiconductor integrated circuit device including a plurality of circuit blocks that are individually controlled in terms of turning-on/off and that are capable of individually executing commands is configured such that timing of activating electric power of one circuit block is controlled such that the activating is performed during a period in which a command is being executed by another circuit block thereby making it possible to prevent an occurrence of a high peak in current due to overlapping of timing of activating electric power among circuit blocks.

In terms of controlling the low power consumption mode, Japanese Unexamined Patent Publication No. 2007-173385 discloses a technique in which when an operation is brought in a resume standby mode to shut off electric power supply to peripheral circuits other than an SRAM memory array while maintaining information stored in the SRAM memory array, the ground level of the memory array is raised by about 0.3 V to reduce leakage currents.

SUMMARY

An investigation has been performed as to a reduction in inrush current that can occur when a low power consumption mode is cancelled in a semiconductor device including a plurality of memory modules having a low power consumption mode. In a semiconductor device of a particular type such as a system-on-chip microcomputer, a processor core, a large number of accelerators, and a large number of memory modules assigned individually thereto are provided in an on-chip form. In such an on-chip semiconductor device, memory modules are disposed at various locations scattering over the whole chip, and the storage capacity thereof varies from one module to another. To control the low power consumption mode of such many memory modules with various storage capacities such that the memory modules exit the low power consumption mode at different timings, if the timing is shifted in series by using daisy chain coupling as disclosed in Japanese Unexamined Patent Publication No. 2007-164822, then it is required to transmit the control signal along a long control signal path, which results in an increase in chip size and an increase in operation time needed to control the low power consumption mode. In the technique disclosed in Japanese Unexamined Patent Publication No. 2008-91030, timing of activating electric power is shifted in a similar manner to that disclosed in Japanese Unexamined Patent Publication No. 2007-164822, and thus the technique has a similar problem.

The present invention discloses a technique of controlling the setting and resetting of the low power consumption mode of a large number of memory modules with various different storage capacities by transmitting a control signal in units of blocks in memory modules thereby controlling the timing of setting and resetting the low power consumption mode. This technique allows a reduction in length of the control signal transmission path and allows a reduction in mode transition time. Thus, it is easy to design a layout of control signal transmission paths in a place and route design of a semiconductor device. This technique disclosed in the present invention and associated advantages provided thereby are not disclosed in any patent document cited above. In particular, in a case where the memory modules include SRAMs and have a resume standby mode as the low power consumption mode in which a lower power consumption state is achieved while maintaining information in the SRAMs, if the technique disclosed in Japanese Unexamined Patent Publication No. 2007-173385 is used, a large inrush current flows over the entire memory array when the resume standby mode is cancelled. In semiconductor devices of the system-on-chip type such as a microcomputer including a plurality of SRAM memory modules having the resume standby mode, it is necessary to minimize the inrush current that occurs when the low power consumption mode is cancelled. However, in addition to the reduction in inrush current, there are other factors that should be taken into account in designing of semiconductor devices, such as an increase in integration density, a reduction in element device size to achieve high integration density, an increase in operating speed, an increase in ease of design, etc., which are taken into consideration in the present invention.

It is an object of the present invention to provide a semiconductor device including a plurality of memory modules having a low power consumption mode and configured to reduce an inrush current that occurs when the low power consumption mode is cancelled.

It is another object of the present invention to provide a technique associated with a semiconductor device as to suppressing of an inrush current that occurs when the low power consumption mode is cancelled for a plurality of memory modules by using a simple configuration, an increase in speed of the operation of cancelling the low power consumption mode, and an increase in easiness of designing the configuration.

Further features and objects of the present invention will become apparent from the following description of embodiments with reference to the attached drawings.

Exemplary aspects of the present invention are described below.

Memory modules each being controlled in terms of setting into and exiting a low power consumption mode by a control signal belong to a memory block. A control signal transmission path is configured such that the control signal is inputted in parallel to the memory modules belonging to the same memory block and is transmitted via an inside-of-module path and applied in parallel to memory modules belonging to the same memory block, and such that the control signal is outputted by a particular memory module of the memory modules via an inside-of-module path and to a downstream outside-of-module path. The particular memory module in the memory block is selected such that it has a greater storage capacity than another memory module belonging to the same memory block.

Thus, a reduction in total length of paths, a reduction in total area occupied by the paths, and a reduction in total propagation time are achieved compared with those achieved in the configuration in which the control signal is transferred in serial from one memory module to another. The above-described particular memory module from which the control signal is transferred to the downstream outside-of-module path is selected such that the particular memory module has a greater storage capacity than another memory module belonging to the same memory block of interest, in other words, the particular memory module is not a memory module having the smallest storage capacity in the memory block. This can prevent many memory modules at an upstream location from being still in the middle of exit transition from the lower power consumption state when memory modules at a downstream location exit from the lower power consumption state, and thus it is possible to prevent an occurrence of a large inrush current. The above-described particular memory modules can be selected from the memory modules in the memory block of interest based on the storage capacities thereof or data related to the storage capacities.

Advantages provided by exemplary aspects of the present invention are briefly described below.

That is, it is possible to suppress an inrush current that occurs when the low power consumption mode is cancelled for a plurality of memory modules. It is also possible to suppress an inrush current that occurs when the low power consumption mode is cancelled for a plurality of memory modules by using a simple configuration, increase the speed of the operation of cancelling the low power consumption mode, and increase the easiness of designing the configuration.

BRIEF DESCRIPTION OF THE DRAWINGS

FIG. 16 is a timing chart illustrating, by way of example, operation timings associated with the microcomputer shown in FIG. 15.

DETAILED DESCRIPTION

Outline of Embodiments

Figure 1:
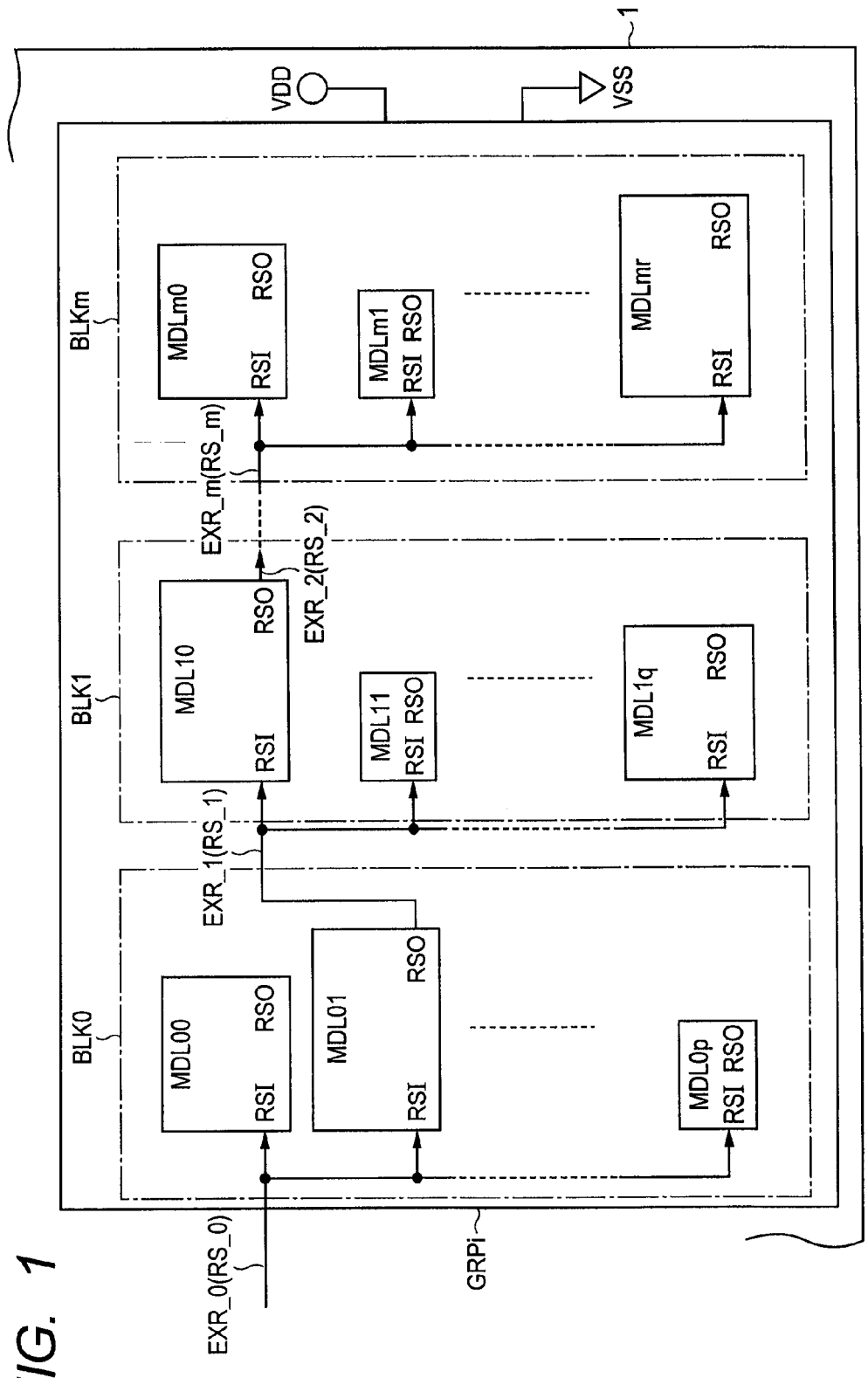
FIG. 1 is a block diagram of a semiconductor device, in which focus is placed on a transmission path of a resume standby signal among memory modules.

First, outlines of exemplarily aspects of the present invention are described below. Reference numerals or symbols in parentheses in the following description indicate, by way of example only, employable elements, and the reference numerals or symbols correspond to those shown in figures.

1. Propagation Path of Mode Control Signal Through Memory Module Having Large Storage Capacity in Group According to a first exemplary aspect of the present invention, a semiconductor device (1) includes a plurality of memory modules (MDLij) disposed on a semiconductor substrate. The memory modules are controlled in terms of setting into and exiting a low power consumption mode by control signals (RS_0 to RS_m). The memory modules (MDLij) belong to a memory block (BLK0 to BLKm). The control signal is inputted in parallel to the memory modules via an upstream outside-of-module path (EXR_0, . . . ) and is transmitted via an inside-of-module path (INRij). The control signal is outputted by a particular memory module of the memory modules via the inside-of-module path to a downstream outside-of-module path (EXR_1, . . . ). The particular memory module in the memory block has a greater storage capacity than another memory modules belonging to this same memory block.

In this aspect, the control signal is supplied in parallel to the memory modules in each memory block, and the control signal is transferred from a particular memory module in the memory block to a downstream memory block. Thus, a reduction in total length of paths, a reduction in total area occupied by the paths, and a reduction in total propagation time are achieved compared with those achieved in the configuration in which the control signal is transferred in serial from one memory module to another. When a memory module changes from the lower power consumption state into a state where the memory module is operable, a current flowing in the memory module increases as its storage capacity does. It is because the circuit size of the memory module increases with the storage capacity. In view of the above, the above-described particular memory module from which the control signal is transferred to the downstream outside-of-module path is selected such that the particular memory module has a greater storage capacity than the other memory modules belonging to the same memory block of interest, in other words, the particular memory module is not a memory module having the smallest storage capacity in the memory block. This can prevent many memory modules in an upstream memory block from being still in the middle of exit transition from the lower power consumption state when memory modules in a downstream memory block exit from the lower power consumption state, and thus it is possible to prevent an occurrence of a large inrush current. The above-described particular memory module can be easily selected from the memory modules in the memory block of interest based on the storage capacities thereof or data related to the storage capacities, and thus it is easy to determine which memory modules should be grouped in respective memory blocks and how transmission lines of the control signal should be laid out in the place and route design. This makes it easy to design the configuration of the semiconductor device.

2. Propagation Time Correlated to Storage Capacity

In the semiconductor device according to item 1, the memory modules may be configured such that the propagation time along the inside-of-module path in the memory module increases with the storage capacity thereof.

Thus, it is ensured that the propagation time along the inside-of-module path is determined taking explicitly into account the correlation between the storage capacity of each memory module and the current that flows in the memory module at the exit transition from the low power consumption mode.

3. Wiring Resistance, Parasitic Capacitance, and Gate Delay

In the semiconductor device according to item 2, delay elements that determine the propagation time along the inside-of-module path may include wiring resistance of a wiring forming the inside-of-module path, parasitic capacitance associated with the wiring, and an operation delay of a driving circuit located in the middle of the wiring.

Thus, it is possible to estimate the propagation time along the inside-of-module path based on the wiring delay and the driving characteristics of the driving circuit.

4. Detection Operation Time of a Circuit that Detects Exiting Low Power Consumption Mode In the semiconductor device according to item 2, delay elements that determine the propagation time along the inside-of-module path may include a detection operation time detected by a detection circuit (CMP, NOR) to detect an operation time needed to cancel the low power consumption mode in response to a change in control signal.

This can logically control the propagation time along the inside-of-module path by the operation of the detection circuit.

5. Outputting Control Signal from Memory Module Having Greatest Storage Capacity In the semiconductor device according to item 2, the particular memory module may be memory modules having a largest storage capacity in the memory block to which the particular memory module belongs.

This ensures that when it is commanded to cancel the lower power consumption state for memory modules in a downstream memory block, substantially all memory modules in an upstream memory block have already exited the lower power consumption state. Thus, it is possible to prevent inrush current peaks from overlapping between memory blocks.

6. Delay Propagation Path of Control Signal

In the semiconductor device according to item 2, the inside-of-module path may be provided such that in a case where the number of bit lines arranged in parallel is larger than the number of word lines arranged in parallel in a memory array, the inside-of-module path extends in a direction crossing the bit lines, while the inside-of-module path extends in a direction crossing the word lines in an opposite case.

This can form the inside-of-module path such that the wiring delay is effectively used.

7. Control Signal to Control Gates of Word Line Non-Selection MOS Transistor In the semiconductor device according to item 3, each memory module may include an array of memory cells with word lines coupled to selection terminals, an address decoder configured to generate a word line selection signal according to an address signal, a word driver configured to selectively drive the word lines to a selection level according to the word line selection signal generated by the address decoder, and a plurality of first MOS transistors (304) that, when turned on, provide an electric potential corresponding to non-selection level to the word lines. When the control signal is in a first state, supplying of a power supply voltage to the address decoder and the word driver is shut off, and the first MOS transistors are turned on whereby the memory module is set in the low power consumption mode. On the other hand, a second state of the control signal causes the memory module to exit the low power consumption mode. The inside-of-module path extends in a direction crossing the direction in which the word lines extend and the inside-of-module path is sequentially coupled to gate electrodes of the respective first MOS transistors such that the control signal propagates from one end of the inside-of-module path toward the other end thereof.

In this aspect, parasitic capacitance associated with the gates of the first MOS transistors contributes to providing a delay to the inside-of-module path.

8. Control Signal for Controlling Gate of MOS Transistor to Provide Hold Current to Static Memory Cell In the semiconductor device according to item 3, each memory module may include an array of memory cells of a static type with data input/output terminals coupled to complementary bit lines, a plurality of second MOS transistors (201) for providing currents to memory cells to maintain data, and third MOS transistors (202) formed in a diode coupled configuration and disposed in parallel to the respective second MOS transistors. When the control signal is in a first state, the second MOS transistors are turned off whereby the memory module is set in the low power consumption mode. On the other hand, when the control signal is in a second state, the memory module exits the low power consumption mode. The inside-of-module path extends in a direction crossing the direction in which the complementary bit lines extend and the inside-of-module path is sequentially coupled to gate electrodes of the respective second MOS transistors such that the control signal propagates from one end of the inside-of-module path toward the other end thereof.

In this configuration, parasitic capacitance associated with the gates of the second MOS transistors contributes to providing a delay to the inside-of-module path.

9. Controlling Gate of MOS Transistor Such that Sense Amplifier Power Switch is Maintained in Off-State In the semiconductor device according to item 3, each memory module may include an array of memory cells of a static type with data input/output terminals coupled to complementary bit lines, a sense amplifier that detects a potential difference between the complementary bit lines and amplifies the detected potential difference, a fourth MOS transistor (414) that, when receiving an enable control signal at a gate electrode, provides an operating current to the sense amplifier, and a fifth MOS transistor (415) that, when selectively turned on, selectively forces a signal path (SAEN) of the enable control signal to a negate level. When the control signal is in a first state, the fifth MOS transistors are turned on whereby the memory module is set in the low power consumption mode. On the other hand, when the control signal is in a second state, the memory module exits the low power consumption mode. The inside-of-module path extends in a direction crossing the direction in which the complementary bit lines extend and the inside-of-module path is sequentially coupled to gate electrodes of the respective fifth MOS transistors such that the control signal is propagates from one end of the inside-of-module path toward the other end thereof.

In this aspect, parasitic capacitance associated with the gates of the fifth MOS transistors contributes to providing a delay component to the inside-of-module path.

10. Standby Mode and Power Supply Shut-Off Mode

In the semiconductor device according to item 1, the low power consumption mode is a standby mode in which supplying of the power supply voltage to part of an internal circuit is shut off while maintaining the information stored in memory cells, or a power supply shut-off mode in which electric power to the internal circuit shut off without maintaining the information in the memory cells.

Thus, it is possible to suppress the inrush current regardless of whether the low power consumption mode is the standby mode or the power supply shut-off mode.

11. CPU and Memory Modules Disposed in Memory Space of the CPU

The semiconductor device according to item 1, may further include a central processing unit (CPU) that executes a command. The memory modules are disposed in a memory space of the central processing unit (2), and the central processing unit outputs the control signal to the memory modules.

In this aspect, it is possible to suppress an inrush current that occurs when the memory modules used by the central processing unit are activated from the low power consumption mode depending on a command execution state of the central processing unit.

12. Accelerator and Memory Modules Disposed in Memory Space Thereof

The semiconductor device according to item 1, may further include a central processing unit that executes a command and an accelerator (3, 4) that performs data processing according to an instruction from the central processing unit. The memory modules are disposed in a local memory space of the accelerator. According to an instruction from the central processing unit, the accelerator outputs the control signal to the memory modules in the local memory space.

In this aspect, it is possible to suppress an inrush current that occurs when the memory modules used by the accelerator are activated from the low power consumption mode depending on a state of data processing performed by the accelerator.

13. Defining the Number of Memory Cells in First to Third Memory Modules

The invention also provides a semiconductor device (1) including a first memory module, a second memory module, and a third memory module each including a memory cell array including memory cells disposed in a matrix and a peripheral circuit that performs reading and writing data from or to memory cells, and each memory module has a standby mode in which the memory module consumes less electric power than in a normal operation mode in which reading or writing from or to the memory cells is performed. The semiconductor device further includes a first control signal line extending such that a control signal for controlling the normal operation mode and the standby mode is transmitted in parallel to the first memory module and the second memory module, and a second control signal line that transmits the control signal to the third memory module via the first memory module. The first memory module has a greater number of memory cells than the second memory module has.

In this semiconductor device, the third memory module is coupled to the first memory module having the greater number of memory cells than the second memory module, and thus as with the semiconductor device according to item 1, a reduction in total length of paths, a reduction in total area occupied by the paths, and a reduction in total propagation time are achieved compared with those achieved in the configuration in which the control signal is transferred in serial from one memory module to another. This can prevent many memory modules at an upstream location from being still in the middle of exit transition from the lower power consumption state when memory modules at a downstream location exit the lower power consumption state, and thus it is possible to prevent an occurrence of a large inrush current.

14. Fourth Memory Module

The semiconductor device according to item 13 may further include a fourth memory module coupled to the second control signal line such that the control signal is transmitted to the fourth memory module via the first memory module.

In this aspect, the timing of activating the fourth memory module from the lower power consumption state is similar to the timing of activating the third memory module from the lower power consumption state with respect to the timing of activating the first and second memory modules.

15. Transistor for Controlling Electric Power to a Peripheral Circuit in a Memory Module The semiconductor device according to item 14 may further include a wiring disposed between the first control signal line and the second control signal line and coupled to a transistor that controls electric power to a peripheral circuit of the first memory module.

In this aspect, a parasitic component of the transistor that controls the electric power is used to delay the signal propagation from the first control signal line to the second control signal line.

16. Transistor for Controlling Electric Power to Memory Cells in a Memory Module The semiconductor device according to item 14 may further include a first wiring disposed between the first control signal line and the second control signal line and coupled to a transistor that controls electric power to memory cells in the first memory module.

In this aspect, a parasitic component of the transistor that controls the electric power to the memory cells is used to delay the signal propagation from the first control signal line to the second control signal line.

17. First Wiring Disposed so as to Extend Along Memory Cell Array

In the semiconductor device according to item 16, the first wiring may be disposed along a memory cell array in the first memory module.

This makes it easy for the first wiring to provide a delay depending on the number of memory cells, i.e., depending on the circuit size of the memory array.

18. Defining the Number of Memory Cells in First to Third Memory Modules

The present invention also provides a semiconductor device (1) including a plurality of memory modules each including a memory cell array including memory cells disposed in a matrix and a peripheral circuit that performs reading and writing data from or to memory cells, each memory module having a standby mode in which the memory module consumes less electric power than in a normal operation mode in which reading or writing from or to the memory cells is performed. In this semiconductor device, the memory modules include a first memory module, a second memory module, and a third memory module, and the memory modules also include a first control signal line extending such that a control signal for controlling the normal operation mode and the standby mode is transmitted to the first memory module and the second memory module, a second control signal line that transmits the control signal to the third memory module via the first control signal line and the first memory module, a first wiring member extending along the memory cell array of the first memory module and coupled to a first transistor of the first memory module and also coupled between the first and second control signal lines, and a second wiring member extending along the memory cell array of the second memory module and coupled to a second transistor of the second memory module. The number of memory cells disposed along the first wiring member in the memory cell array in the first memory module is larger than the number of memory cells disposed along the second wiring member in the memory cell array in the second memory module.

In this semiconductor device, the third memory module is coupled to the first memory module having the greater number of memory cells disposed along the wiring member than the second memory module, and thus as with the semiconductor device according to item 1, a reduction in total length of paths, a reduction in total area occupied by the paths, and a reduction in total propagation time are achieved compared with those achieved in the configuration in which the control signal is transferred in serial from one memory module to another. This can prevent many memory modules at an upstream location from being still in the middle of exit transition from the lower power consumption state when memory modules at a downstream location exit the lower power consumption state, and thus it is possible to prevent an occurrence of a large inrush current.

19. Transistor that Controls Electric Power to Peripheral Circuit in Memory Module In the semiconductor device according to item 18, the first transistors may include a transistor that controls electric power to the peripheral circuit.

In this aspect, a parasitic component of the transistor that controls the electric power is used to delay the signal propagation from the first control signal line to the second control signal line.

20. Transistor for Controlling Electric Power to Memory Cells in a Memory Module In the semiconductor device according to item 19, the second transistors include a transistor that controls electric power to the memory cells in the memory module.

In this item, a parasitic component of the transistor that controls the electric power to the memory cells is used to delay the signal propagation from the first control signal line to the second control signal line.

DETAILED DESCRIPTION OF THE EMBODIMENTS

The present invention is described in further detail below with reference to embodiments.

First Embodiment

FIG. 1 illustrates an example of a semiconductor device according to a first embodiment of the invention. The semiconductor device shown in FIG. 1 is formed on a single semiconductor substrate such as a single-crystal silicon substrate by using, for example, CMOS integrated circuit production technology. In FIG. 1, of memory groups provided in the semiconductor device 1, only one memory group GRPi is illustrated by way of example. The memory group GRPi includes a plurality of SRAM modules MDL00 to MDL0$p$, MDL10 to MDL1$q$, and MDLm0 to MDLmr. In FIG. 1, block sizes of SRAM modules MDL00 to MDL0$p$, MDL10 to MDL1$q$, and MDLm0 to MDLmr are changed so as to schematically illustrate storage capacities thereof.

The storage capacity depends on the number of memory cells, and thus the storage capacity depends on the product of the number of rows and the number of columns of memory cells. When each row equally includes a particular number of memory cells, the storage capacity increases with the number of rows. Similarly, when each column equally includes a particular number of memory cells, the storage capacity increases with the number of columns. When each memory cell array or memory mat equally has a particular storage capacity, the total storage capacity increases with the number of memory cell arrays or memory mats.

SRAM modules MDL00 to MDL0$p$, MDL10 to MDL1$q$, and MDLm0 to MDLmr are used as, by way of example but not limitation, a work area or a program area of a CPU or an accelerator, a work area or a control register of a peripheral circuit, a memory area assigned to a control register of a peripheral circuit, etc., which are not shown in FIG. 1. In FIG. 1, details of buses serving as access paths, accessing sources, etc., are not shown. In the following description, all or one of SRAM modules such as MDL00 to MDL0$p$, MDL10 to MDL1$q$, and MDLm0 to MDLmr will be generically represented as SRAM module MDLij.

Each SRAM module MDLij includes a memory cell array in which static type memory cells are arranged in a matrix, and a peripheral circuit for reading/writing data from/to memory cells. Each SRAM module MDLij has a resume standby mode as one of low power consumption modes. The resume standby mode is, by way of example, a low power consumption mode in which the voltage supply to the peripheral circuit is shut off while retaining the information stored in the memory cells.

In other words, each SRAM module MDLij is configured as follows.

Each SRAM module MDLij has a normal operation mode in which it is enabled to reading and writing data from/to memory cells.

In a state in which the reading and writing operation is not performed while maintaining data in the memory cells, the peripheral circuit does not perform an operation associated with the reading and writing, and thus power consumption is low. In this state, the memory module consumes less electric power than in the normal operation mode.

This state can be achieved in the resume standby mode, the standby mode, or the low power consumption mode.

In the resume standby mode, the standby mode, or the low power consumption mode, the voltage applied to the memory cells may be reduced while maintaining the data in the memory cells (by decreasing the power supply voltage or increasing the ground voltage).

Each SRAM module MDLij has an input node RSI for inputting a resume standby signal functioning as a control signal to set and reset the resume standby mode and also has an output node RSO for outputting the resume standby signal inputted from the input node RSI to the outside after the resume standby signal is transmitted inside the SRAM module MDLij. The input node RSI and the output node RSO are electrically conductive parts such as a node and a via, on wirings formed on a semiconductor chip, and they are not necessarily particular electrode pads or bumps.

In the memory group GRPi including a plurality of SRAM modules, SRAM modules MDL00 to MDL0$p$ belong to a memory block BLK0, and a resume standby signal RS_0 is supplied in parallel to input nodes RSI of the respective SRAM modules MDL00 to MDL0$p$ via an outside-of-module path EXR_0.

The outside-of-module path refers to a path that is coupled to a memory module and that is also used to couple a plurality of memory modules. In the specific example shown in FIG. 1, a signal line extending from RS0 of the SRAM module MDL01 and coupled to RS1 of MDL10 and RS1 of MDL11 is an example of an outside-of-module path. Outside-of-module paths are usually formed by metal wirings.

In practical semiconductor devices (semiconductor chips), in addition to outside-of-module paths, inside-of-module paths described later are also formed by metal wirings.

Therefore, there is no clear boundary between outside-of-module paths and inside-of-module paths. In other words, outside-of-module paths are continuous with some inside-of-module paths.

Paths extending in the vicinity (for example, within a particular range from a memory cell array) may be regarded as inside-of-module path, and paths extending further away (for example, out of the particular range from the memory cell array) may be regarded as outside-of-module paths.

The memory block BLK0 includes SRAM modules MDL00 to MDL0$p$ whose input nodes RSI are coupled in common to the outside-of-module path EXR_0. In this regard of the physical configuration in terms of coupling, the SRAM modules MDL00 to MDL0$p$ form one hierarchical layer. Hierarchical layers of SRAM modules may be defined in different manners depending on features in question such as to whether SRAM modules are located close to each other in a particular area on a chip and share a particular outside-of-module path EXR_0, or as to whether SRAM modules should be set in or cancelled synchronously. In the memory group GRPi, SRAM modules MDL10 to MDL1$q$ belong to a memory block BLK1 and a resume standby signal RS_1 is supplied in parallel to input nodes RSI of the respective SRAM modules MDL10 to MDL1$q$ via an outside-of-module path EXR_1. Similarly, SRAM modules MDL00 to MDLmr in the memory group GRPi belong to a memory block BLKm and a resume standby signal RS_m is supplied in parallel to input nodes RSI of the respective SRAM modules MDL00 to MDLmr via an outside-of-module path EXR_m. The memory blocks BLK1 and BLKm are respectively hierarchized in the same manner as the memory block BLK0.

The outside-of-module path EXR_0, which transmits the resume standby signal RS_0, is coupled to a circuit that controls setting and resetting of the resume standby mode of all SRAM modules MDLij in the memory group GRPi. A base end of the outside-of-module path EXR_1, which transmits the resume standby signal RS_1, is coupled to an output terminal RS0 of the SRAM module MDL01 which is one of SRAM modules included in the upstream memory block BLK0. This SRAM module MDL01 has the greatest storage capacity among SRAM modules in the memory block BLK0. A base end of an outside-of-module path EXR_2 that transmits a resume standby signal RS_2 is coupled to an output terminal RS0 of the SRAM module MDL10 which is one of SRAM modules included in the upstream memory block BLK1. The SRAM module MDL10 has the greatest storage capacity among SRAM modules in the memory block BLK1. A base end of the outside-of-module path EXR_m that transmits the resume standby signal RS_m is coupled to an output terminal RS0 (not shown) of a SRAM module that is one of SRAM modules included in an upstream memory block and that has the greatest storage capacity in this upstream memory block.

The propagation time of the resume standby signal since the input thereof to the input node RSI of the SRAM module MDLij until the output thereof from the output node RSO depends on the storage capacity of the SRAM module MDLij, and more specifically, the propagation delay time increases with the storage capacity. In short, the propagation time is defined as the elapsed time since the resume standby signal indicating that the SRAM module of interest is to exit the resume standby state is inputted until the SRAM module of interest reaches the state in which the SRAM module is operable, or defined by a time related to the above-described time (for example, defined by a time until a peak of an inrush current has gone although the operable state has not yet been reached). Because the circuit size of the memory array or that of the associated peripheral circuit increases with the storage capacity, the time necessary for various parts thereof such as a power supply node, a signal node, etc., to settle down in a stable state in which the SRAM module is operable increases with the storage capacity.

As described above, the number of rows/columns of memory cells in the memory cell array increases with the storage capacity of the memory module. For example, let it be assumed that the resume standby signal propagates in a direction along rows of memory cells. In this case, for the same storage capacity, the path length decreases as the number of memory cells in row decreases (i.e., as the number of memory cells in column increases). Therefore, when the path length is small, it is required to obtain a necessary delay time by increasing the delay due to the parasitic capacitance delay associated with gates of MOS transistors and/or the operation delay of logic gates such as inverters. On the other hand, in a case where the resume standby signal propagates in a direction along columns of memory cells, the path length decreases as the number of memory cells in column decreases (i.e., as the number of memory cells in row increases) for the same storage capacity. Therefore, when the path length is small, it is required to obtain a necessary delay time by increasing the delay due to the parasitic capacitance delay associated with gates of MOS transistors and/or the operation delay of logic gates such as inverters.

Figure 2:
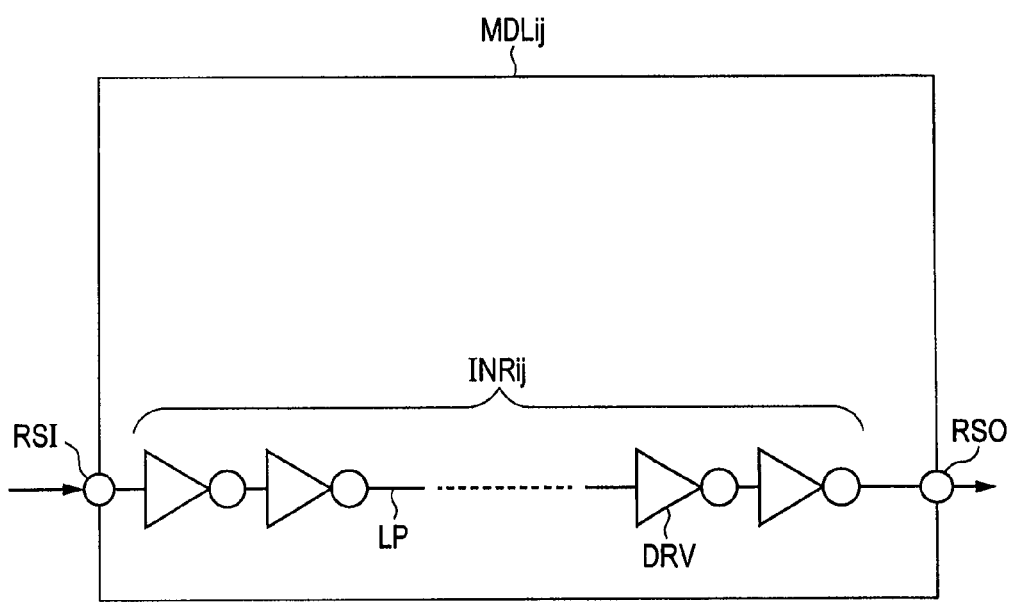
FIG. 2 is a diagram illustrating delay elements that determine a propagation time along an inside-of-module path INRij of a resume standby signal, for a case where the delay elements include a wiring resistance of a wiring of the inside-of-module path, parasitic capacitance associated with the wiring, and an operation delay of a driving circuit located in the path.

In the inside-of-module path INRij of the resume standby signal from the input node RSI to the output node RSO, the propagation time thereof is determined by delay elements including, as illustrated by way of example in FIG. 2, wiring resistance of a wiring LP forming the inside-of-module path INRij, parasitic capacitance associated with the wiring LP, and an operation delay of a driving circuit DRV located in the middle of the wiring LP. In other words, it is possible to estimate the propagation time for the inside-of-module path INRij based on the delay of the wiring LP and the driving characteristic of the driving circuit DRV. Other factors such as parasitic capacitance that contribute to the delay in the transmission of the resume standby signal along the inside-of-module path from the input node RSI to the output node RSO will be described in detail later.

Figure 6:
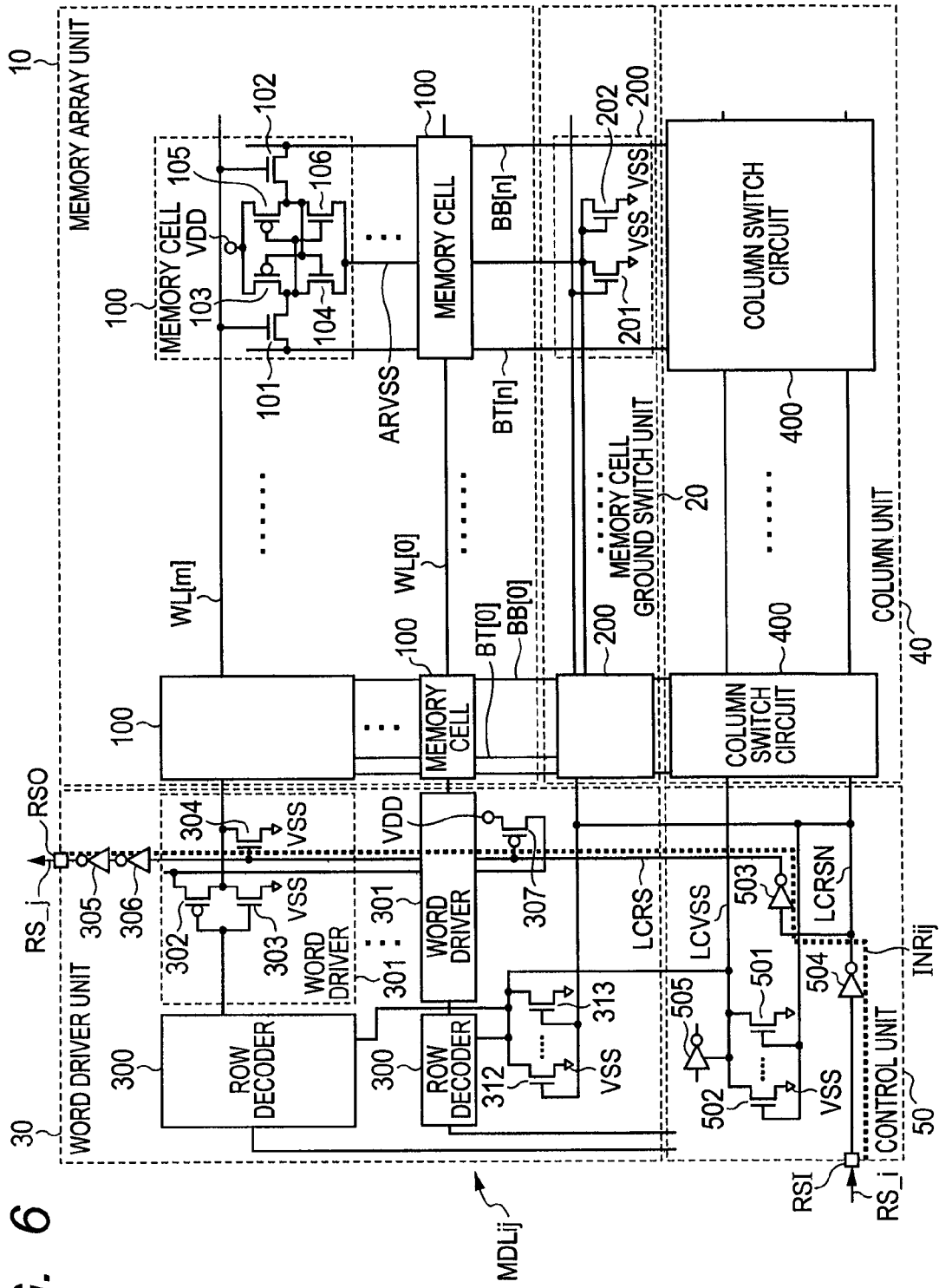
FIG. 6 is a circuit diagram illustrating a specific example of a memory module in which an inside-of-module path INRij extends in a direction crossing word lines.

The inside-of-module path is provided individually in each memory module. For example, as shown in FIG. 6, the inside-of-module path is formed so as to extend along an array of memory cells in the memory module or along the word line drivers or column units.

Figure 3:
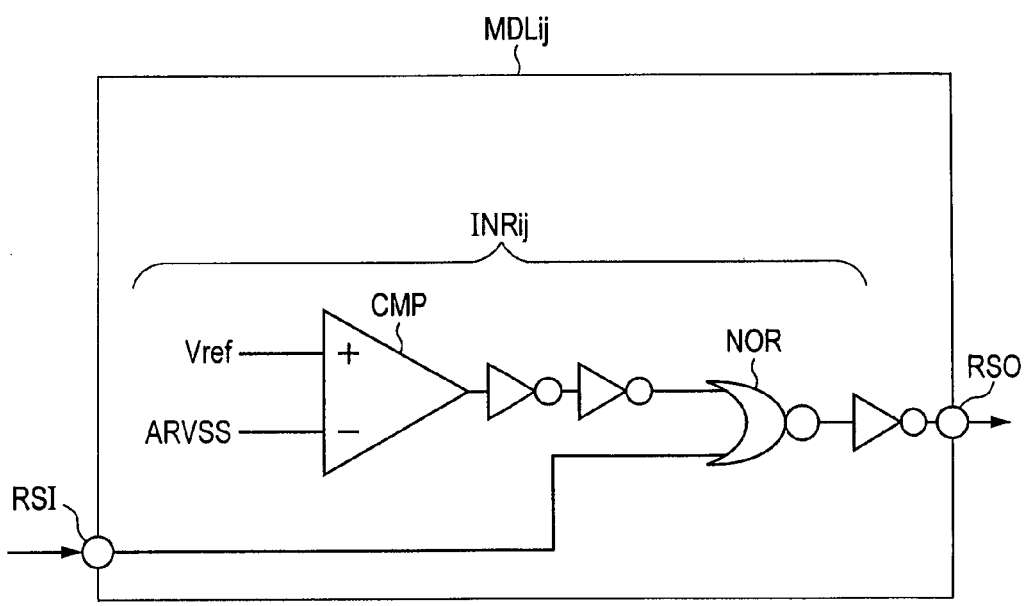
FIG. 3 is a diagram illustrating delay elements that determine a propagation time along an inside-of-module path INRij for a case in which a detection circuit CMP is used to detect an operation time needed to cancel a resume standby mode in response to a negate change in a resume standby signal and the detected operation time is used as the propagation time.

In another example shown in FIG. 3, as one of delay elements that determine the propagation time along the inside-of-module path INRij, an operation time detected by a detection circuit CMP since the resume standby mode is set until the resume standby mode is reset in response to a negate change in the resume standby signal. For example, the SRAM module may be configured such that when the SRAM module is set in the resume standby mode, the voltage of the reference node ARVSS of the memory array is raised to a level a few hundred mV higher than the ground voltage VSS to thereby suppress the current flowing through storage nodes of the memory cells thereby reducing the leakage current in the memory array. In this configuration, the detection circuit CMP is disposed to determine whether the voltage of the reference node ARVSS is lower than the reference voltage Vref. When the resume standby signal supplied to the input node RSI is negated to the low level to cancel the resume standby mode, if the voltage of the reference node ARVSS drops down below the reference voltage Vref, then this state is detected by the NOR gate and the resume standby signal outputted from the output node RSO is negated to the low level.

Figure 4:
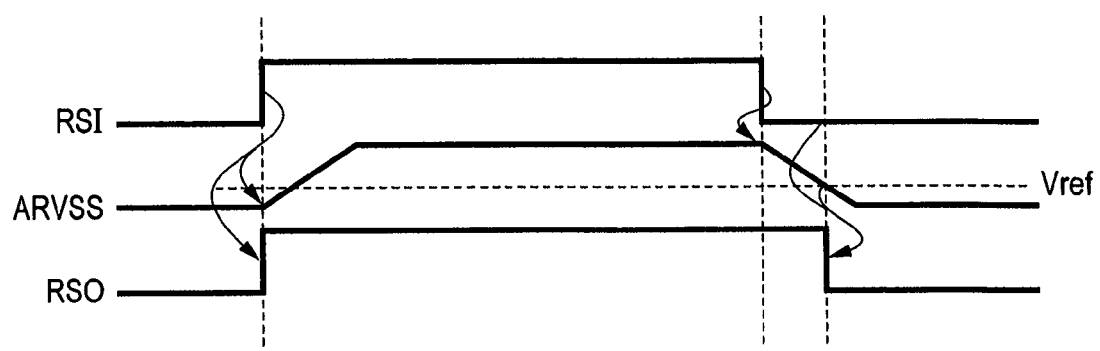
FIG. 4 is a timing chart illustrating, by way of example, timing associated with an operation of the circuit configuration shown in FIG. 3 in terms of setting and cancelling a resume standby.

FIG. 4 illustrates, by way of example, timings associated with an operation of the circuit configuration shown in FIG. 3 in terms of setting and cancelling the resume standby mode. When the input node RSI is changed to a high level at time t0, the SRAM module MDLij is set into the resume standby state. At time t1, the input node RSI is changed to a low level to reset the SRAM module MDLij from the resume standby state. In response, the ground voltage is supplied to the reference node ARVSS of the memory array, and thus the voltage of the reference node ARVSS drops down below the reference voltage Vref. As a result, the output node RSO is negated to the low level, and thus the resume standby cancel command is transferred to the downstream SRAM module. In FIG. 4, Td denotes the propagation delay time which is a time elapsed since the resume standby cancel command is inputted, at the input node RSI, to the SRAM module MDLij until it is outputted from the output node RSO to the downstream SRAM module.

According to FIG. 3 and FIG. 4, it is possible to logically control the propagation time along the inside-of-module path INRij by the operation of the detection circuit CMP.

As described above, the resume standby signals (RS_0, RS_1, . . . ) are supplied in parallel to the SRAM modules (MDL00 to MDL0$p$, MDL10 to MDL1$q$, . . . ) in units of memory blocks (BLK0, BLK1, . . . ) and the resume standby signals are transferred such that a resume standby signal passing through part of the SRAM modules (MDL01, MDL10, . . . ) in a memory block is provided to a following memory block (EXR_1, EXR_2, . . . ). This can reduce the outside-of-module paths (EXR_1, EXR_2, . . . ), the area size occupied by the paths (EXR_1, EXR_2, . . . ), and the propagation time compared with the configuration in which the resume standby signal is transferred in serial from one SRAM module to another.

Figure 5:
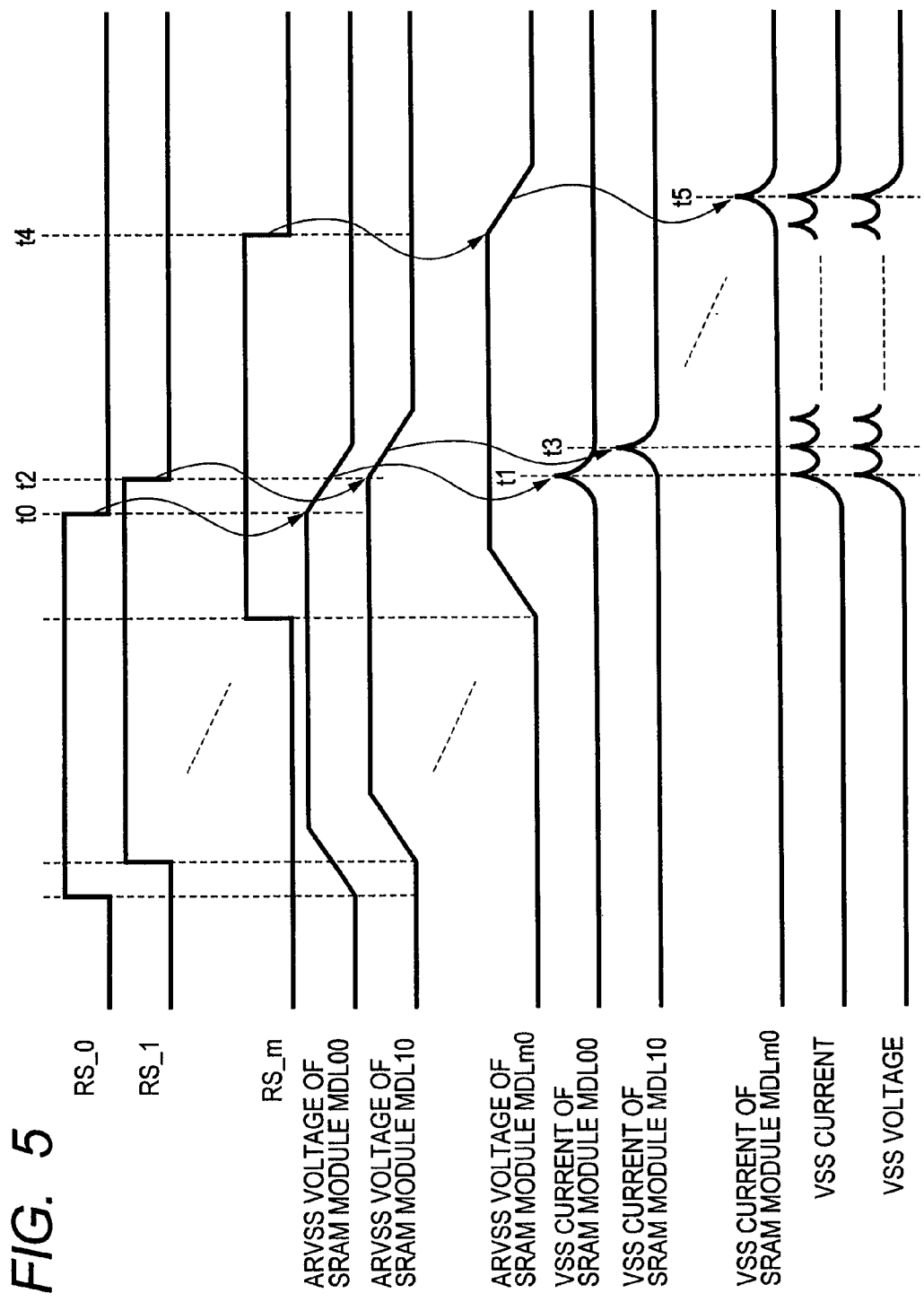
FIG. 5 is an operation timing chart illustrating an operation in which overlapping of inrush current peaks among memory blocks.

When an SRAM module transits from a lower power consumption state to a normal state in which the SRAM module is operable, the greater the storage capacity of this SRAM module, the greater the current flowing through this SRAM module at the transition. This is because the total circuit size of the SRAM module increases as the storage capacity increases. Because the particular SRAM module through which the resume standby signal is transmitted and transferred to the outside-of-module path at the downstream location is selected such that it is not the SRAM module having the smallest storage capacity in the memory block of interest, it is possible to prevent many SRAM modules in the upstream memory block from being still in the middle of the exit transition from the lower power consumption state when the SRAM modules in the downstream memory block, and thus it is possible to prevent a large inrush current from occurring. In the case where the SRAM module having the greatest storage capacity in the memory block of interest is selected as the particular SRAM module, it is possible for substantially all SRAM modules in this memory block to have already exited the resume standby state when the SRAM modules in the downstream memory block start exiting the resume standby state. Thus, it is ensured that overlapping of inrush current peaks between memory blocks does not occur. In a specific example shown in FIG. 5, if the resume standby signal RS_0 is negated at time to, an inrush current peak occurs at time t1 due to a reduction in the voltage at a node ARVSS of the SRAM module MDL01 having the greatest storage capacity in the memory block BLK0. If the resume standby signal RS_1 is then negated at time t2 thereafter, an inrush current peak occurs at time t3 due to a reduction in the voltage at a node ARVSS of the SRAM module MDL10 having the greatest storage capacity in the memory block BLK1. The inrush current peak at time t1 is the last peak that occurs in the memory block BLK0. The resume standby signal RS_1 is negated after this last peak in the memory block BLK0, and thus no overlapping occurs between the inrush current peak occurring in the memory block BLK0 and the inrush current peak occurring in the adjacent memory block BLK1. Similarly, in the memory block BLK1, the last inrush current peak occurs at time t3. Because the negation of the resume standby signal RS_2 is performed after the occurrence of the last inrush current peak at time t3, no overlapping occurs between the inrush current peak occurring in the memory block BLK1 and the inrush current peak occurring in the adjacent memory block BLK2.

In view of the above, the particular SRAM module from which the resume standby signal is to be supplied to the downstream memory block can be determined based on the storage capacity or the data correlated to the storage capacity. This makes it easy to design the wiring layout of the transmission paths (outside-of-module paths) via which the resume standby signals are transmitted, and makes it easy to determine which SRAM modules are to be included in which memory block. Thus, it becomes possible to automatically make a design using a layout tool in terms of which SRAM module is to be selected as a SRAM module from which a resume standby signal is supplied to a downstream memory block, and in terms of a layout of an outside-of-module path.

For example, in FIG. 1, the memory module MDL01 may be employed as the first memory module, the memory module MDL00 as the second memory module, and the memory module MDL10 as the third memory module.

The control signal for controlling the normal operation mode and the standby mode is transmitted via the control signal line EXR_0 (RS_0) serving as the first control signal line coupled to the first memory module MDL01 and the second memory module MDL00.

The control signal is applied in parallel to the first memory module MDL01 and the second memory module MDL00.

The control signal is applied to the third memory module MDL10 in such a manner that the control signal is outputted from the first memory module MDL01 having a greater number of memory cells than the number of memory cells of the second memory module MDL00, and the control signal is applied to the third memory module MDL10 via the control signal line EXR_1 (RS_1) serving as the second control signal line.

By selecting the control signal path such that the control signal is supplied from the first memory module MDL01 to the third memory module MDL10, it is possible to achieve a greater shift between inrush current peaks than in a case where the control signal is supplied from the second memory module MDL00 to the third memory module MDL10.

This is because the first memory module has a greater number of memory cells than the second memory module has, and thus the control signal transferred via the first memory module has a greater delay than the delay that would be provided via the second memory module.

Other memory modules such as a fourth memory module MDL11 may also be coupled to the second control signal line EXR_1 (RS_1).

Second Embodiment

FIG. 6 illustrates a specific example of an SRAM module in which an inside-of-module path INRij extends in a direction crossing word lines. In an example of a configuration shown FIG. 6, the SRAM module MDLij includes a memory array unit 10, a memory cell ground switch unit 20, a word driver unit 30, a column unit 40, and a control unit 50.

In the memory array unit 10, static-type memory cells 100 are arranged in a matrix form. Each memory cell 100 has a CMOS static latch including p-channel type MOS transistors 103 and 105 and n-channel type MOS transistors 104 and 106. The storage node thereof is coupled to corresponding complementary bit lines (BT[0], BB[0], . . . , BT[n], BB[n]) via n-channel type selection MOS transistors 101 and 102. Gate electrodes of the respective selection MOS transistors 101 and 102 are coupled to corresponding word lines (WL[0], . . . , WL[m]).

Source electrodes of the respective MOS transistors 103 and 105 in the static latch are coupled to a power supply terminal VDD, and source electrodes of the respective MOS transistors 104 and 106 are coupled to a reference node ARVSS. The reference node ARVSS is, by way of example, provided such that each memory cell column has its own reference node ARVSS.

The memory cell ground switch unit 20 includes memory cell ground switch circuits 200 provided for respective memory cell columns. Each memory cell ground switch circuit 200 includes an n-channel type switch MOS transistor 201 that selectively couples corresponding one of the reference nodes ARVSS to a ground voltage VSS, and an n-channel type diode MOS transistor 202 provided in a diode coupled configuration (in which a drain electrode of the transistor 202 is coupled to a gate electrode thereof) disposed in parallel to the switch MOS transistor 201. The switching of the switch MOS transistor 201 is controlled by a control signal LCRSN. When the switch MOS transistor 201 is in an on-state, the corresponding reference node ARVSS is applied with the ground voltage VSS. On the other hand, when the switch MOS transistor 201 is in an off-state, the corresponding reference node ARVSS has a level higher than the ground voltage VSS by a voltage corresponding to a threshold voltage of the MOS transistor 202. This can reduce a current (a leakage current) flowing through the storage node in the resume standby state thereby ensuring that the information is retained in the memory cell 100.

The word driver unit 30 includes row decoders 300 and word drivers 301 provided for the respective word lines WL[0], . . . , WL[m]. Each row decoder 300 generates a word line selection signal by decoding a row address signal according to a decoding algorithm. Each word driver 301 has a CMOS driver that drives a corresponding one of word lines WL[0], . . . , WL[m] in accordance with the word line selection signal input thereto. The CMOS driver includes a p-channel type MOS transistor 302 and an n-channel type MOS transistor 303. The word driver 301 further includes an n-channel type pull-down MOS transistor 304 for fixing the corresponding one of the word lines WL[0], . . . , WL[m] to the ground voltage VSS serving as a memory-cell non-selection level in the resume standby state, and also includes a p-channel type power switch MOS transistor 307 that shuts off power supply voltage VDD to the MOS transistor 302 in the CMOS driver in the resume standby state. Switching of the MOS transistors 304 and 307 is controlled by a control signal LCRS. In the word driver circuit 30, the row decoder 300 and other circuits are supplied with the ground voltage VSS via n-channel type power switch MOS transistors 312 and 311 shown by way of example in FIG. 6. Switching of the power switch MOS transistors 311 and 312 is controlled by a control signal LCRSN.

The column unit 40 includes column switch circuits 400 and column decoders (not shown) provided for the respective complementary bit lines BT[0], BB[0], . . . , BT[n], BB[n]. Each column decoder generates a complementary bit line selection signal by decoding a column address signal and supplies the resultant complementary bit line selection signal to corresponding one of the column switch circuit 400. The details of the column unit 40 will be described later.

The control circuit 50 also includes, although not shown in the figure, a timing control circuit that receives an access control signal such as a read/write signal or an output enable signal and generates a timing signal for controlling the timing of the memory operation, and also includes an address buffer for buffering address signals (row address signal, column address signal). To these circuits, the ground voltage VSS is supplied via n-channel type power switch MOS transistors 501 and 502 shown by way of example. Switching of the power switch MOS transistors 501 and 502 is controlled by a control signal LCRSN.

If the control circuit 50 receives a resume standby signal RS_i via an input node RSI, the resume standby signal RS_i is inverted by an inverter 504 thereby generating the control signal LCRSN. The control signal LCRSN is further inverted by an inverter 503 thereby generating the control signal LCRS. The signal line for transmitting the control signal LCRS extends in a direction crossing the word lines WL[0], . . . , WL[m], i.e., extends in the same direction in which complementary bit lines extend. At the end of this signal line, a two-stage inverter (including inverters 305 and 306) is coupled thereto, and an output from the inverter 305 is coupled to an output node RSO. In a case where a downstream SRAM module is coupled to the output node RSO, the resume standby signal RS_j is outputted thereto from the output node RSO.

In the example shown in FIG. 6, a majority part of the inside-of-module path INRij for transmitting the resume standby signal RS_i extends in a direction crossing the word lines. The total delay time, since a change appears in the resume standby signal RS_i inputted to the inside-of-module path INRij till the change in the input resume standby signal RS_i reflects in the signal outputted as the resume standby signal RS_j therefrom, is determined by the wiring resistance, the inverting operation delay times of the inverters 503 to 506, and parasitic capacitance of the gate of the MOS transistors 304 and 307. Thus, the gate parasitic capacitance of MOS transistors 304 and 307 contributes to providing the delay in transmission along the inside-of-module path INRij. This makes it unnecessary to provide a large number of inverters for creating a delay or increase the length of the inside-of-module path INRij. For example, in a case where many gates are disposed to increase the delay, a non-negligible leak current can occur during the gate operation. This would result in a loss of the advantage of the reduction in leak current in the memory cells achieved by raising the electric potential of the node ARVSS in the resume standby state.

In the example described above with reference to FIG. 6, LCRS is assumed to a control signal. However, LCRS may also be regarded as a wiring line for transmitting the control signal coupled to the transistor 307 for controlling the electric power to the peripheral circuit.

In this view, this wiring line may also be regarded as being provided between the first control signal line EXR_0 (RS_0) and the second control signal line EXR_1 (RS_1).

Furthermore, the wiring member may include inverters such as those shown in FIG. 2.

The LCRS wiring line (wiring member) extends in the same direction as that in which bit lines of the memory cell array unit extend.

Therefore, the length of the wiring line (wiring member) increases as the number of rows of the memory array increases.

In FIG. 6, LCRSN is assumed to be a control signal. However, LCRSN may also be a wiring line for transmitting the control signal coupled to the memory cell ground switch circuit (including transistors and configured to control electric power to the memory cells).

In this view, this wiring line may also be regarded as being provided between the first control signal line EXR_0 (RS_0) and the second control signal line EXR_1 (RS_1).

Furthermore, the wiring member may include inverters such as those shown in FIG. 2.

The LCRSN wiring line (wiring member) extends in the same direction as that in which word lines of the memory cell array unit extend.

Therefore, the length of the wiring line (wiring member) increases as the number of columns of the memory array increases.

Third Embodiment

Figure 7:
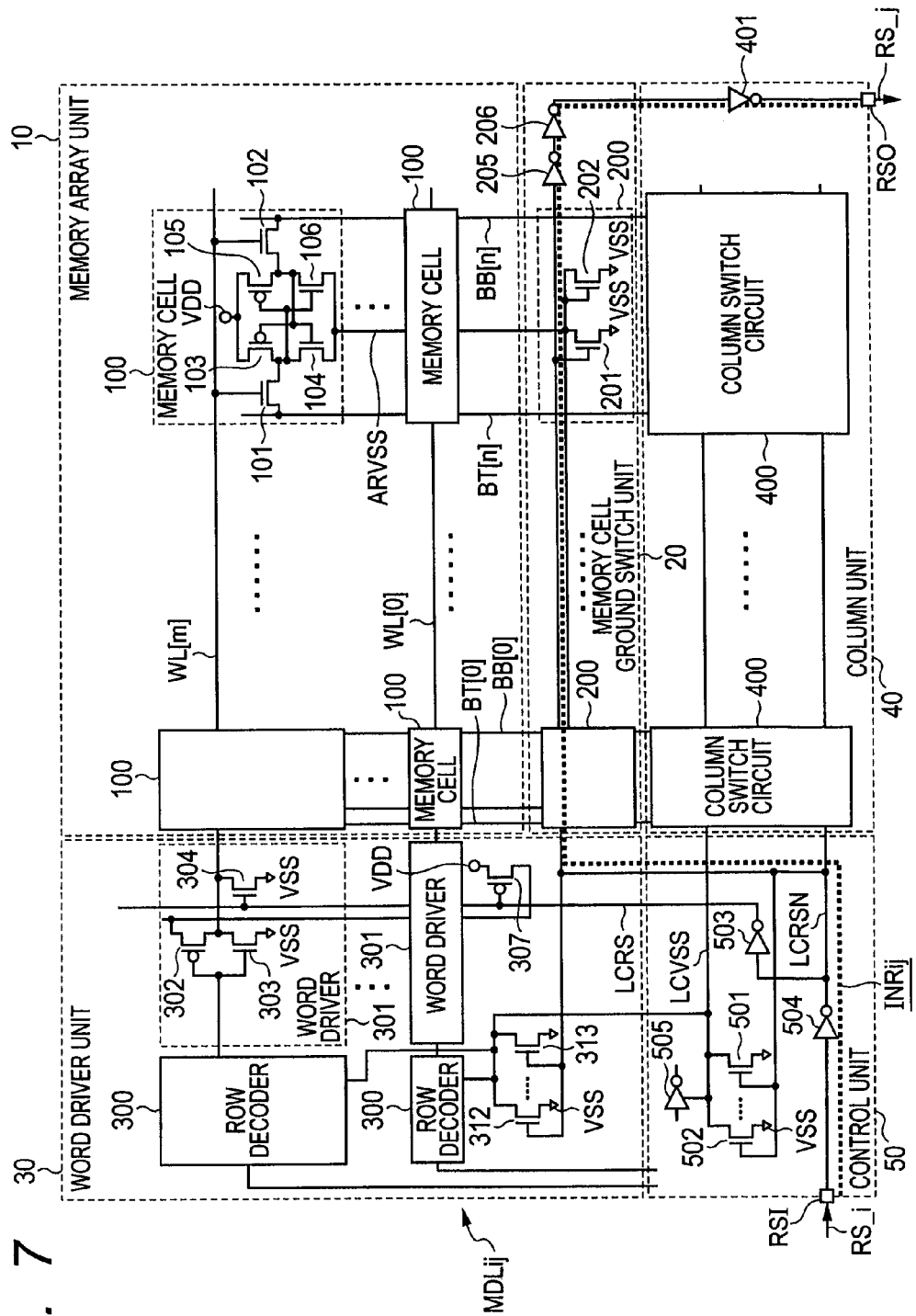
FIG. 7 is a circuit diagram illustrating a specific example of a memory module in which an inside-of-module path INRij extends in a direction crossing bit lines.

FIG. 7 illustrates a specific example of an SRAM module in which an inside-of-module path INRij extends in a direction crossing bit lines. The SRAM module shown in FIG. 7 is different in configuration from that shown in FIG. 6 in that the control signal LCRSN is transmitted in the direction in which the word lines WL[0] to WL[m] extend along the array of MOS transistors 201 arranged in the memory cell ground switch unit 20, i.e., transmitted in the direction crossing the bit lines BT[0], BB[0] to BT[n], BB[n], and then outputted to the output node RSO via a series of inverters 206, 206, and 401.

A majority part of the inside-of-module path INRij for transmitting the resume standby signal RS_i extends in the direction crossing the bit lines as shown in FIG. 7. The total delay time, since a change appears in the resume standby signal RS_i inputted to the inside-of-module path INRij till the change in the input resume standby signal RS_i reflects in the signal output as the resume standby signal RS_j therefrom, is determined by the wiring resistance, the inverting operation delay times of the inverters 503, 205, 206, and 401, and gate parasitic capacitance of the MOS transistors 201.

Thus, the gate parasitic capacitance of many MOS transistors 201 contributes to providing the delay in transmission along the inside-of-module path INRij. As with the configuration shown in FIG. 6, this makes it unnecessary to provide a large number of inverters for creating a delay or increase the length of the inside-of-module path INRij.

In FIG. 7, LCRS is assumed to a control signal. However, LCRS may also be regarded as a wiring line for transmitting the control signal coupled to the transistor 307 for controlling the electric power to the peripheral circuit.

In this view, this wiring line may also be regarded as being provided between the first control signal line EXR_0 (RS_0) and the second control signal line EXR_1 (RS_1).

Furthermore, the wiring member may include inverters such as those shown in FIG. 2.

In FIG. 7, LCRSN is assumed to be a control signal. However, LCRSN may also be a wiring line for transmitting the control signal coupled to the memory cell ground switch circuit (including transistors and configured to control electric power to the memory cells).

In this view, this wiring line may also be regarded as being provided between the first control signal line EXR_0 (RS_0) and the second control signal line EXR_1 (RS_1).

Furthermore, the wiring member may include inverters such as those shown in FIG. 2.

The LCRSN wiring line (wiring member) extends in the same direction as that in which word lines of the memory cell array unit extend.

Therefore, the length of the wiring line (wiring member) increases as the number of columns of the memory array increases. Referring again to FIG. 1, the discussion is continued taking the first memory module MDL01 and the second memory module MDL00 as examples.

As shown in FIG. 1, the number of columns in the memory array is greater in the first memory module MDL01 than in the second memory module MDL00.

In FIG. 1, the control signal is applied to the third memory module MDL10 via the first memory module MDL01 and the second control signal line EXR_1 (RS_1).

By selecting the control signal path such that the control signal is supplied from the first memory module MDL01 to the third memory module MDL10, it is possible to achieve a greater shift between inrush current peaks than in a case where the control signal is supplied from the second memory module MDL00 to the third memory module MDL10.

This also applies to other embodiments described below.

Fourth Embodiment

Figure 8:
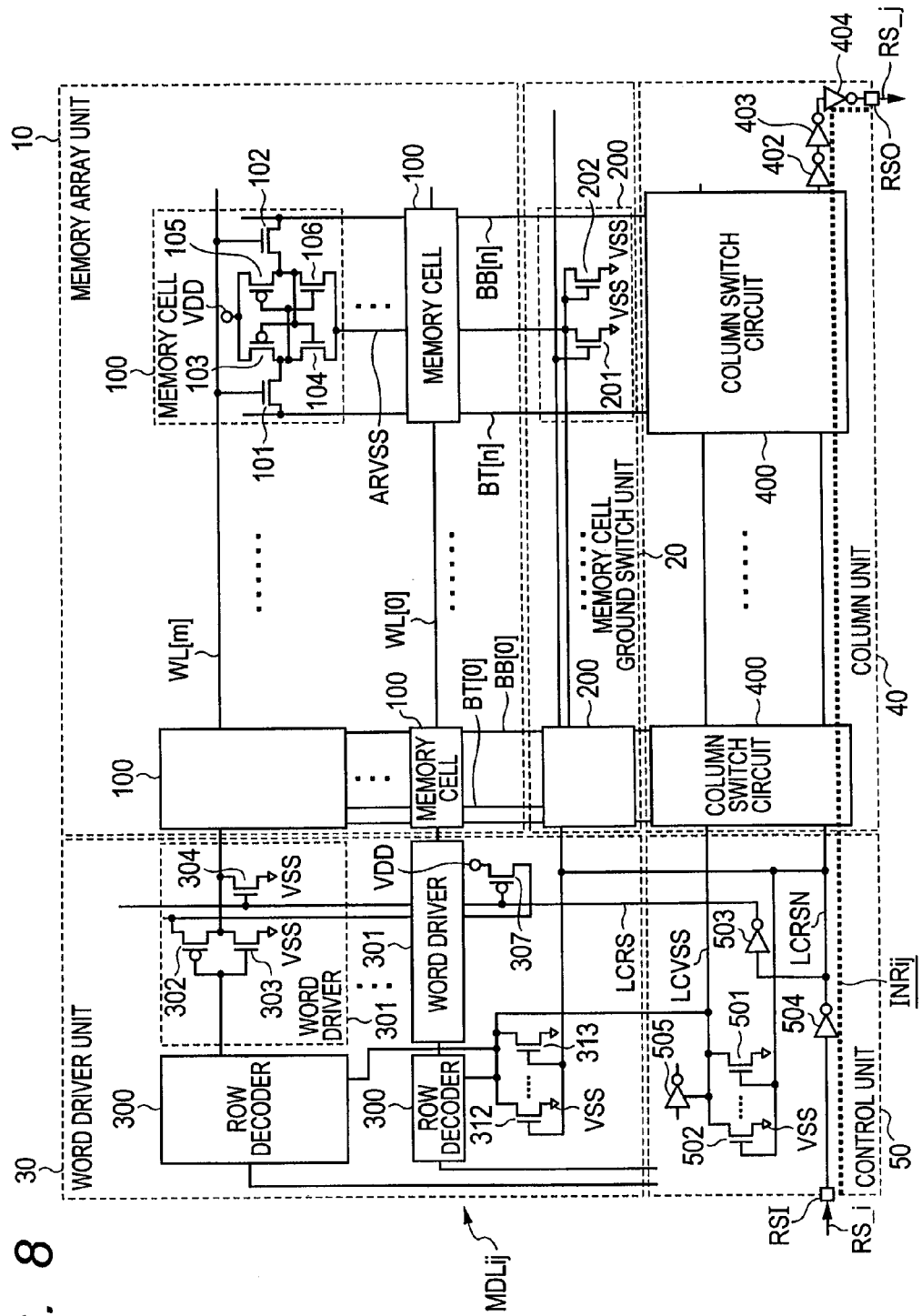
FIG. 8 is a diagram illustrating a specific example of a memory module in which an inside-of-module path INRij extends along an array of column circuits.

FIG. 8 illustrates a specific example of an SRAM module in which the inside-of-module path INRij extends along the array of column circuits. The SRAM module shown in FIG. 8 is different in configuration from that shown in FIG. 6 in that the control signal LCRSN is transmitted along the array of the column switch circuits 400 in the column unit 40 and outputted to the output node RSO via a series of inverters 402 and 403.

Figure 9:
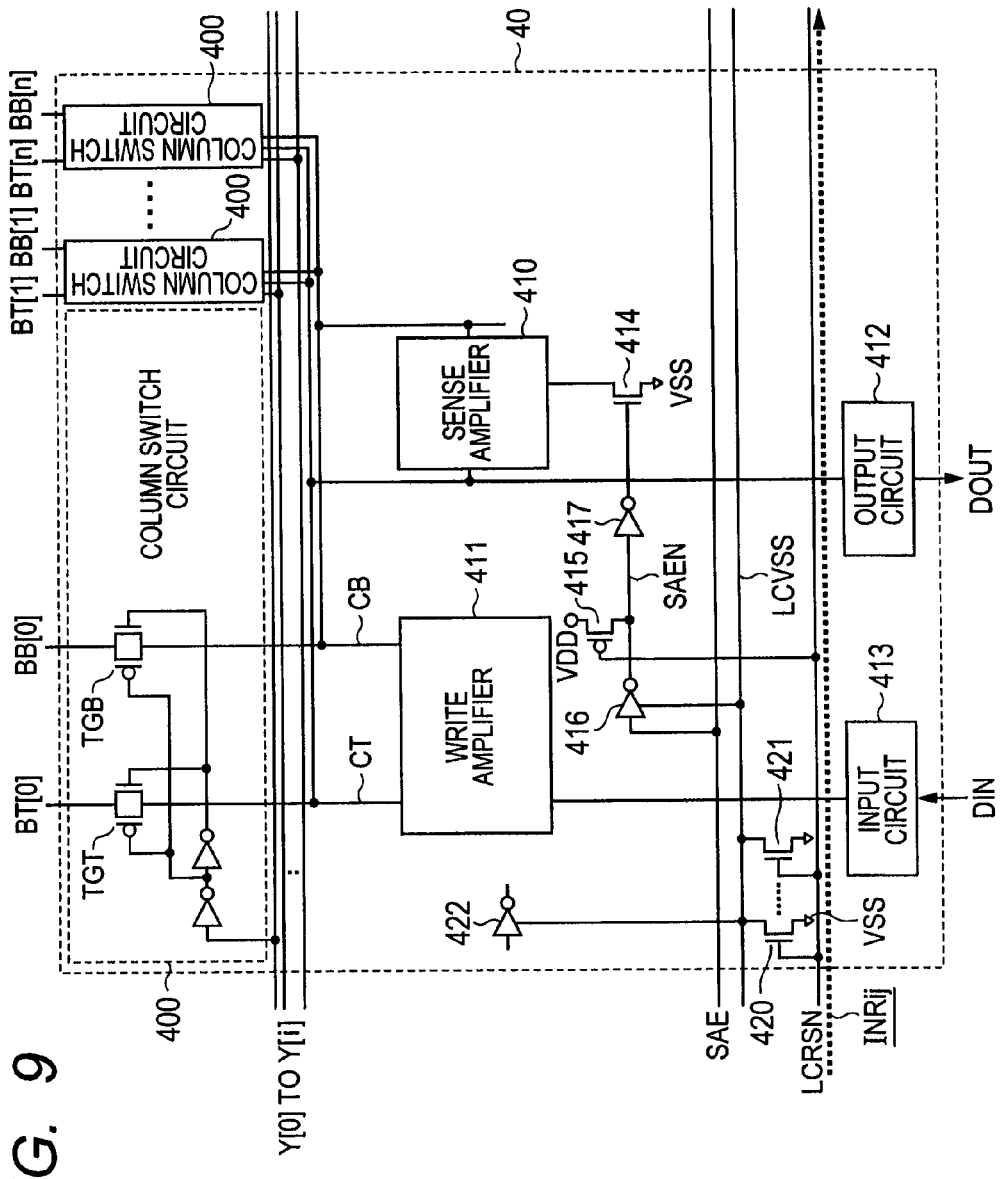
FIG. 9 is a circuit diagram illustrating a specific example of a column unit.

FIG. 9 illustrates a specific example of a configuration of the column unit 40. The complementary bit lines BT[0], BB[0] to BT[n], BB[n] are coupled to complementary common data lines CT and CB via corresponding one of the column switch circuits 400. When the column switch circuit 400 receives a column selection signals Y[0], . . . , Y[n], if the input column selection signal Y[i] has the selection level, then CMOS transfer gates TGT and TGB are turned on such that the corresponding complementary bit lines BT[i] and BB[i] are electrically coupled to the complementary common data lines CT and CB.

The complementary common data lines CT and CB are coupled to the write amplifier 411 and the sense amplifier 410. The write amplifier 411 drives the complementary common data lines CT and CB to complementary levels according to logical values of write data supplied to an input circuit 413 thereby driving the complementary bit lines BT[i] and BB[i] selected by the column switch circuit 400 to complementary levels. The sense amplifier 410 senses a read signal read over the complementary bit lines BT[i] and BB[i] via the column switch circuit 400, and amplifies it and outputs the resultant amplified signal to an output circuit 412. The output circuit 412 outputs the read data to DOUT such that read data has a logical value corresponding to the signal level supplied from the sense amplifier 410.

The sense amplifier 410 is coupled to the ground voltage VSS via an n-channel type power switch MOS transistor 414. A sense amplifier enable control signal SAE supplied from the control unit 50 is applied to a gate electrode of the power switch MOS transistor 414 via a series of a clocked inverter 416 and an inverter 417. The output of the clocked inverter 416 is coupled to an output signal path SAEN. In the middle of the output signal path SAEN, there is provided a p-channel type pull-up MOS transistor 415 that turns on/off according to a control signal LCRSN. In the column unit 40, the control signal is supplied to gate electrodes of n-channel type power switch MOS transistors 420 and 421 coupled to the ground voltage VSS to thereby selectively disable the operation of the clocked inverter 416 and other circuit element 422. In the resume standby state, if the control signal LCRSN is raised to a high level, the clocked inverter 416 goes into a high output impedance state and the pull-up MOS transistor 415 goes into an on-state and thus the power switch MOS transistor 414 of the sense amplifier 410 goes in an off-state and stays in this state.

A majority part of the inside-of-module path INRij for transmitting the resume standby signal RS_i extends along the array of column switch circuits 400 as shown in FIG. 9. The total delay time, since a change appears in the resume standby signal RS_i inputted to the inside-of-module path INRij till the change in the input resume standby signal RS_i reflects in the signal output as the resume standby signal RS_j therefrom, is determined by the wiring resistance, the inverting operation delay times of the inverters 504 and 402 to 404, and gate parasitic capacitance of the MOS transistors 420, 421, and 414.

Thus, the gate parasitic capacitance of many MOS transistors 420, 421, and 414 contributes to providing the delay in transmission along the inside-of-module path INRij. As with the configuration shown in FIG. 6, this makes it unnecessary to provide a large number of inverters for creating a required delay or increase the length of the inside-of-module path INRij.

Fifth Embodiment

Figure 10:
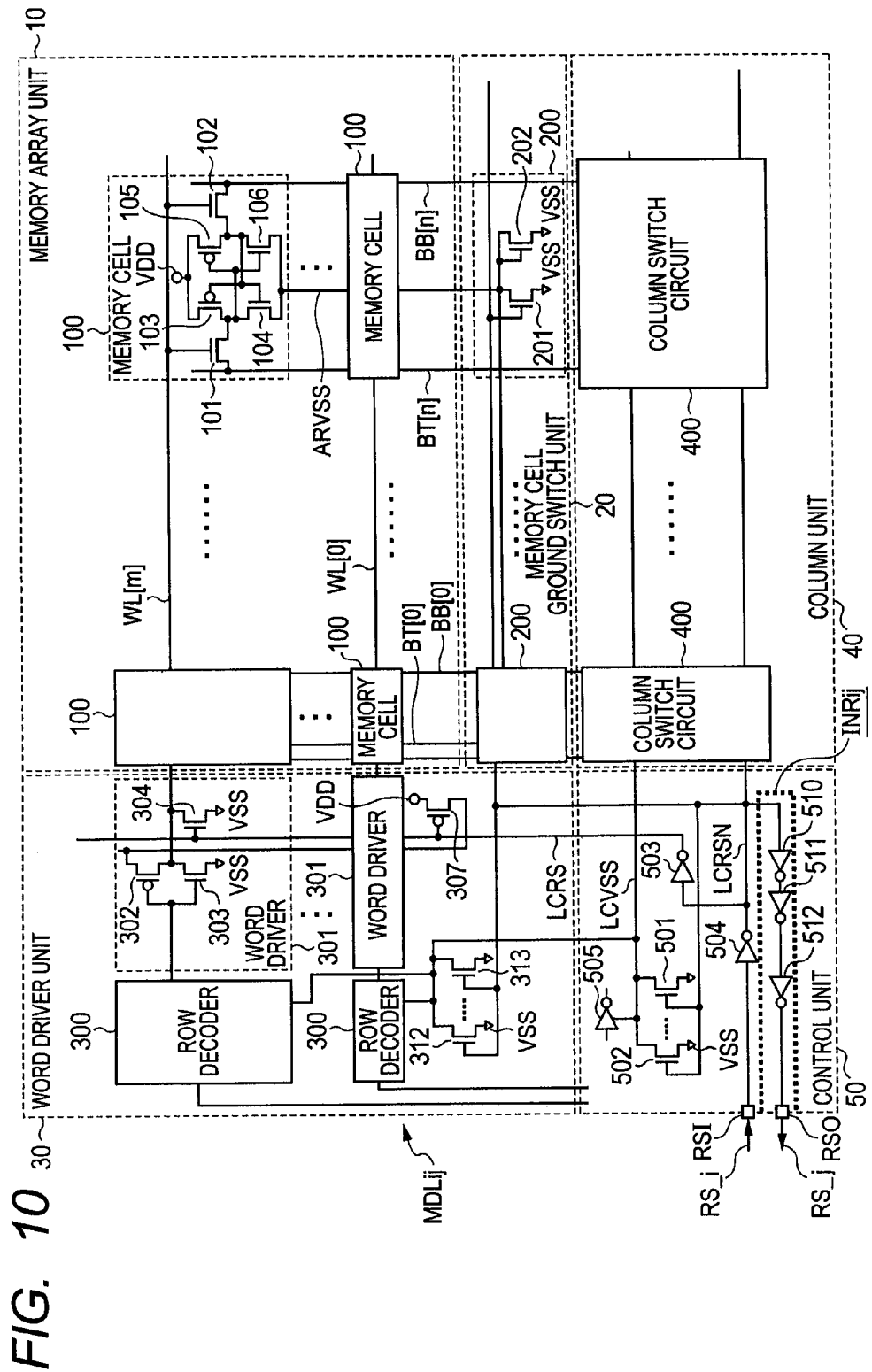
FIG. 10 is a circuit diagram illustrating a specific example of a memory module in which an inside-of-module path INRij is formed in a control unit such that a large number of inverters are disposed in the inside-of-module path INRij thereby providing inverting operation delays.

FIG. 10 illustrates a specific example in which the inside-of-module path INRij is formed in the control unit 50 such that the total delay thereof includes inverting operation delays of many inverters. The SRAM module shown in FIG. 10 is different in configuration from that shown in FIG. 6 in that the control signal LCRSN is transmitted inside the control unit 50 such that the control signal LCRSN is outputted to the output node RSO via a series of inverters 504 and 510 to 512 etc.

As shown in FIG. 10, the inside-of-module path INRij for transmitting the resume standby signal RS_i is formed inside the control unit 50, and the inverting operation delays of the inverters 504 and 510 to 512 mainly determine the total delay time since the resume standby signal RS_i is inputted to the inside-of-module path INRij till the change in the input resume standby signal RS_i reflects in the signal output as the resume standby signal RS_j therefrom.

In this configuration, the necessary delay can be achieved by a short length of the inside-of-module path INRij although the serial of inverters 504 and 510 to 512 is necessary and the gate parasitic capacitance of MOS transistors does not contribute to the delay, which may result in an increase in the total chip size.

Figure 11:
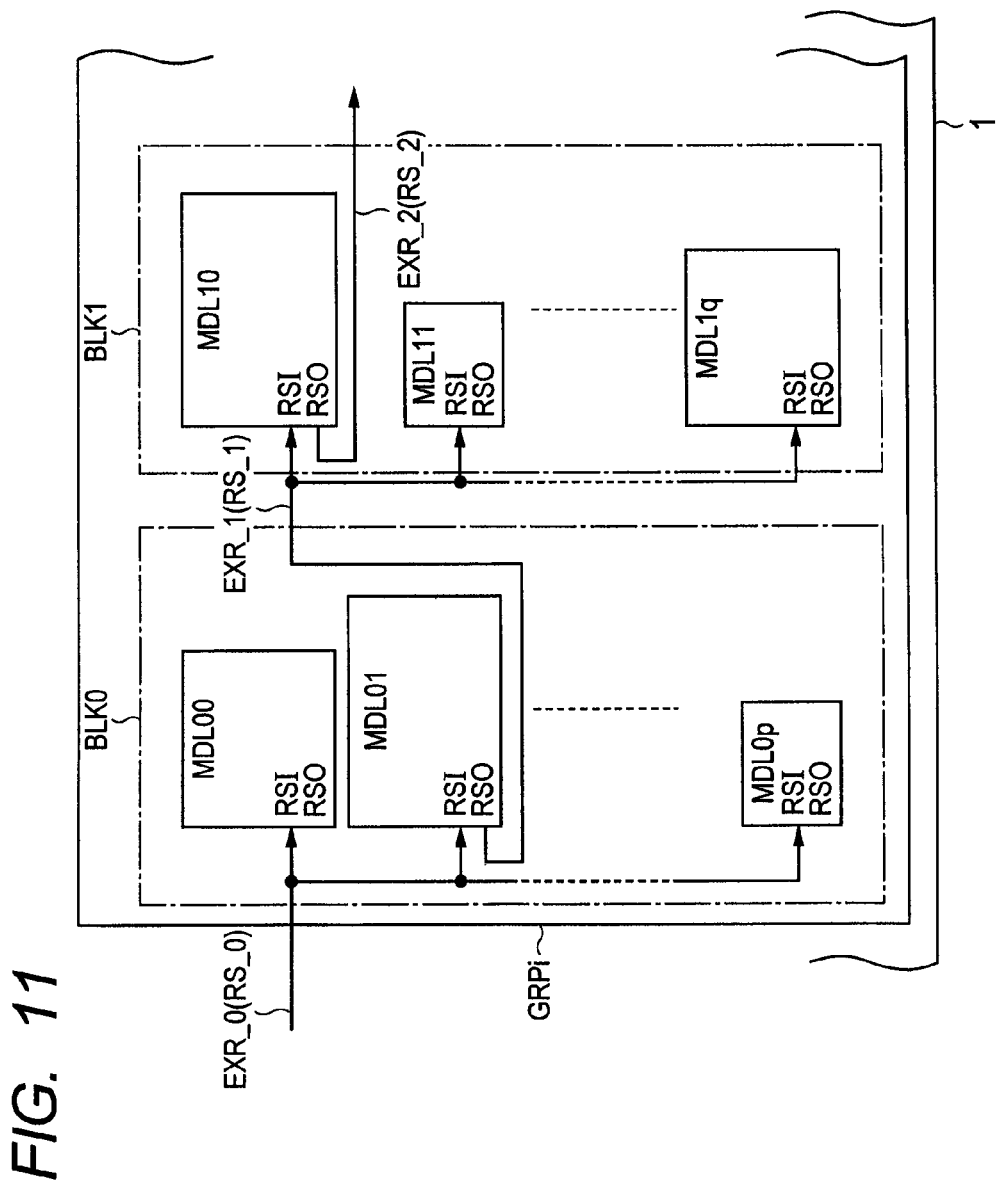
FIG. 11 is a block diagram illustrating an example of an outside-of-module path in a case where an inside-of-module path INRij is formed in the manner shown in FIG. 10.

In the case where the inside-of-module path INRij is disposed as shown in FIG. 10, the outside-of-module paths EXR_1 and EXR_2 are disposed not in the manner shown in FIG. 1 but as shown in FIG. 11.

Figure 12:
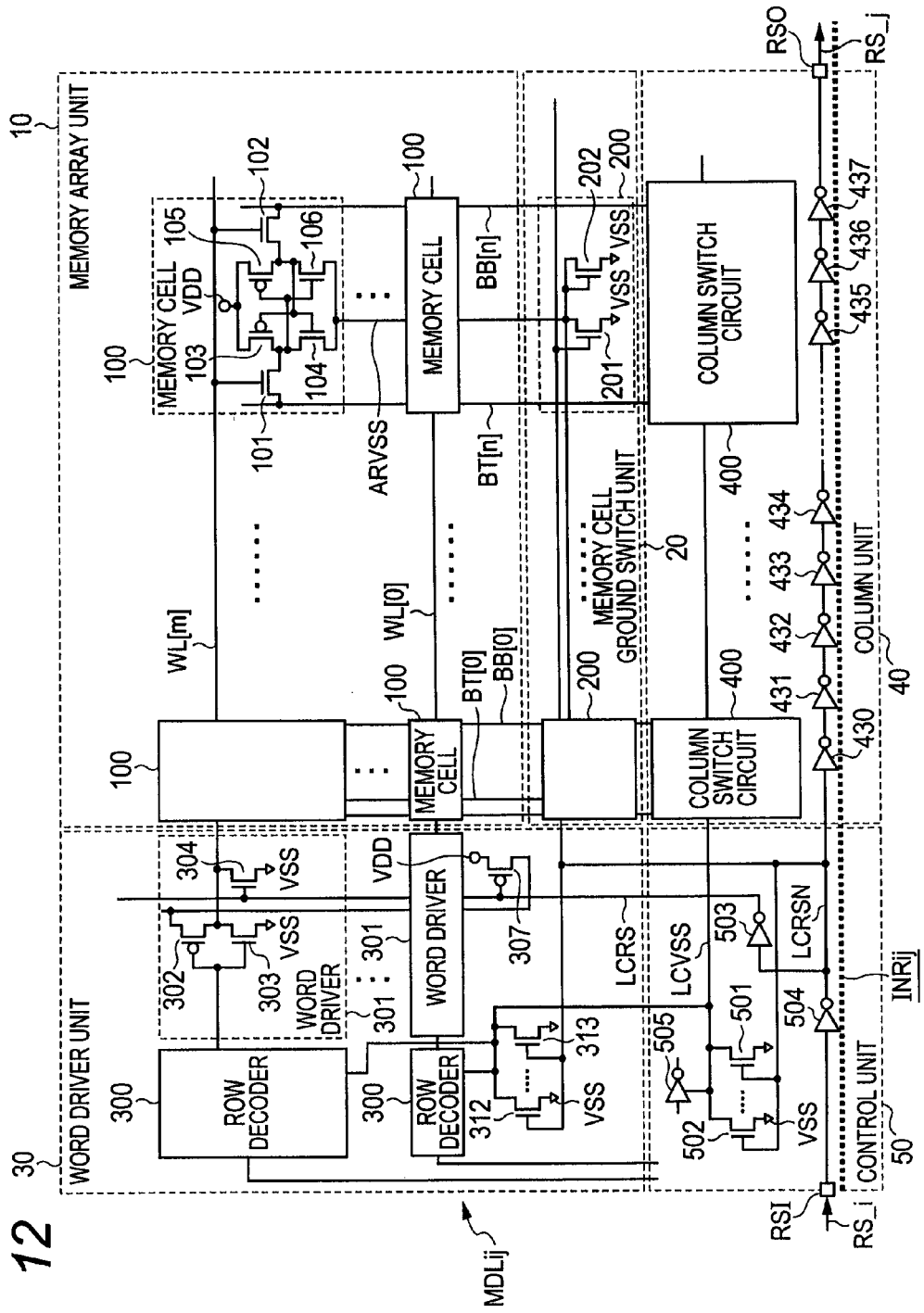
FIG. 12 is a circuit diagram illustrating an example of a memory module in which an inside-of-module path INRij is formed such that the inside-of-module path INRij includes a large number of inverters arranged along an array of column switch circuits in a column unit.

As described above with reference to FIG. 10, to provide the necessary delay in the transmission by using the inverting operation delays of the inverters, the region in which the inside-of-module path INRij for transmitting the resume standby signal is formed is not limited to the inside of the control unit 50, but the inside-of-module path INRij may extend in other regions. For example, as shown in FIG. 12, many inverters 430 to 437 may be disposed along the array of column switch circuits 400 in the column unit 40, and the inside-of-module path INRij may be formed so as to pass through these inverters.

Figure 13:
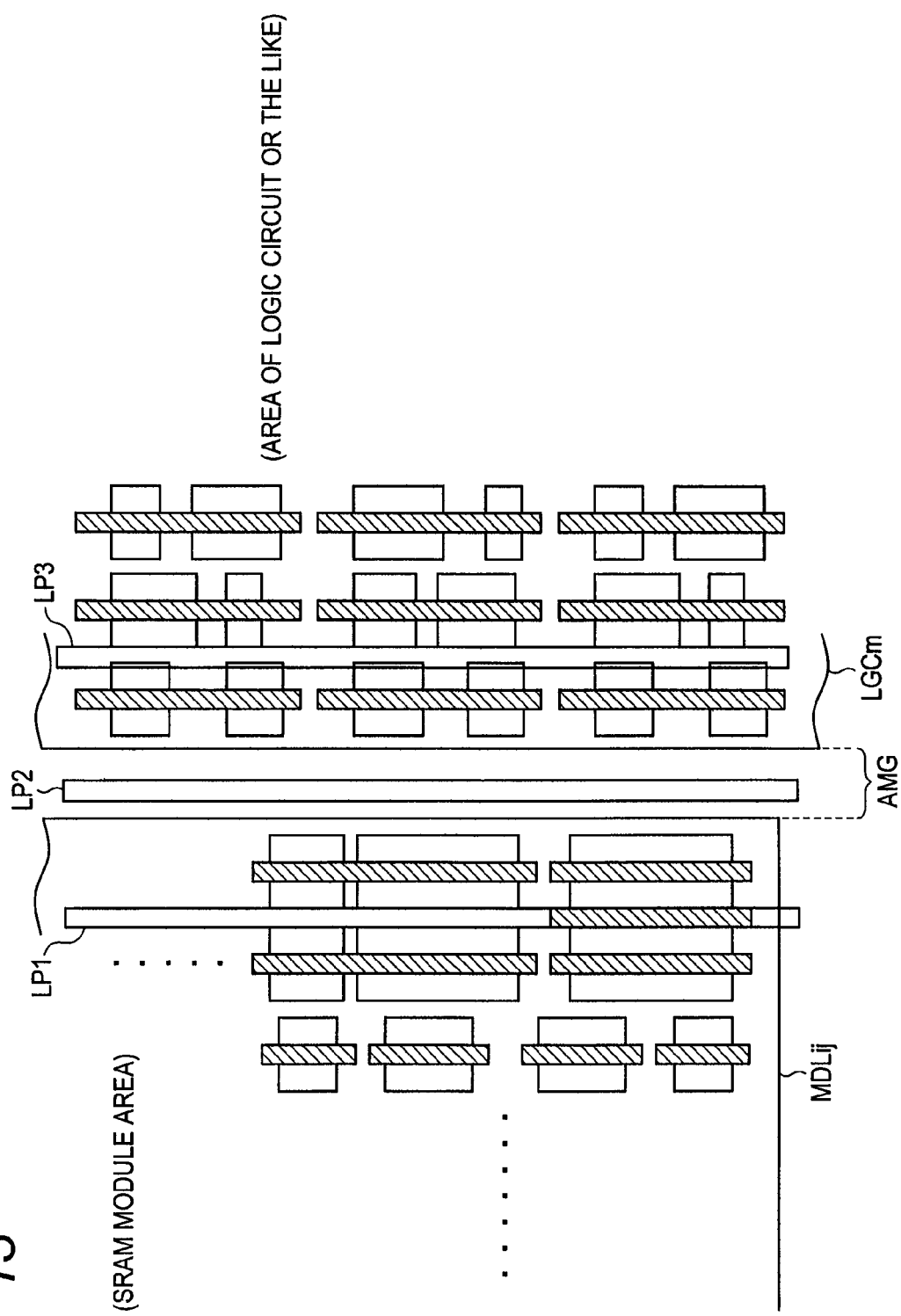
FIG. 13 is a planar layout diagram illustrating an example of a layout of a wiring layout pattern forming an inside-of-module path INRij.

FIG. 13 illustrates an example of a wiring pattern layout of the inside-of-module path INRij. The extending region of the inside-of-module path INRij is not strictly limited to the inside of the SRAM module of interest, but the inside-of-module path INRij is allowed to partially extend in an outer region close to the SRAM module. For example, let it be assumed that a logic circuit module LGCm is disposed close to the SRAM module MDLij, as in the example shown in FIG. 13. In FIG. 13, reference symbol GT denotes a gate wiring and DF denotes a diffusion region. The SRAM module MDLij and the logic circuit module LGCij are both high in transistor density, while a boundary region between the SRAM module MDLij and the logic circuit module LGCij is low in transistor density. In FIG. 13, AMG denotes such a boundary region. A wiring forming the inside-of-module path INRij of the SRAM module MDLij may be formed by a wire of metal such as aluminum. In the case where the inside-of-module path INRij is formed so as to extend in the direction in which word lines extend or in the direction in which bit lines extend as described above, it may be formed, as a wiring line LP1 as shown in FIG. 13, within the region of the SRAM module MDLij of interest. On the other hand, in the case where mainly gate delays are used as in the example shown in FIG. 10 or FIG. 12, the restriction on the region of the wiring is low, and thus, for example, a wiring LP2 in the boundary region AMG, a wiring LP3 in the logic circuit module LGCij, etc., may be used. In particular, when circuit elements such as inverters in the logic circuit module LGCij are used as elements for providing gate delays, the inside-of-module path INRij may include part of the wiring LP2 or LP3.

Figure 14:
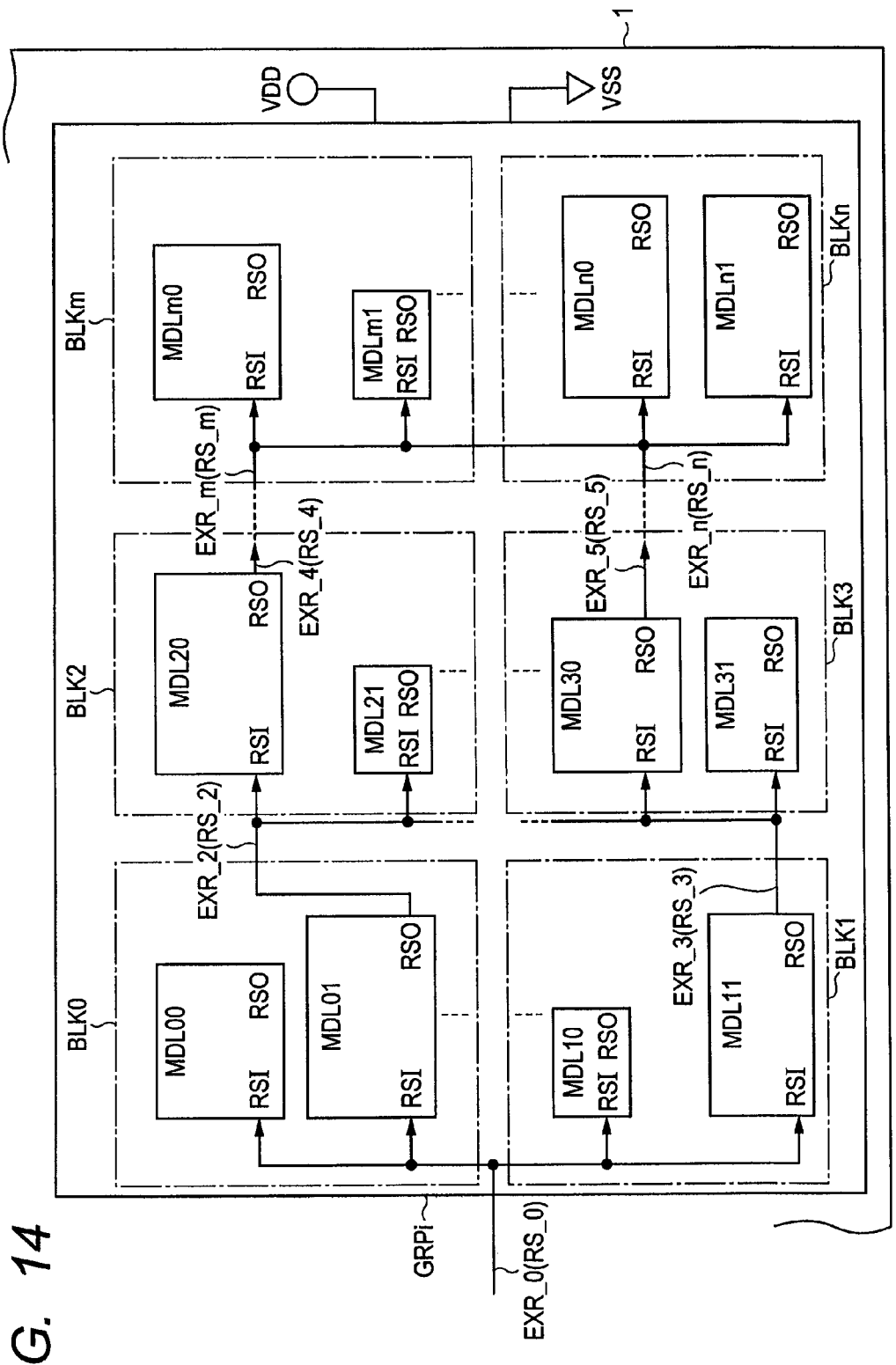
FIG. 14 is a block diagram illustrating an example of a memory group including two series of memory blocks along which a resume standby signal is transmitted.

FIG. 14 illustrates an example in which two signal lines extending through different series of memory blocks are used to transmit the resume standby signal. More specifically, the outside-of-module path EXR_0 is divided into two paths, one of which extends through a series of memory blocks BLK0, BLK2, and BLKm and the other one of which extends through a series of memory blocks BLK1, BLK3, and BLKn. If it is desirable that peak current, which is generated when the standby state is cancelled, be dispersed more precisely, the transmission paths of the resume standby signal may be divided into a greater number of paths. It is also allowed to dispose a single memory module with a large storage capacity in the middle of a series of memory blocks.

Sixth Embodiment

Figure 15:
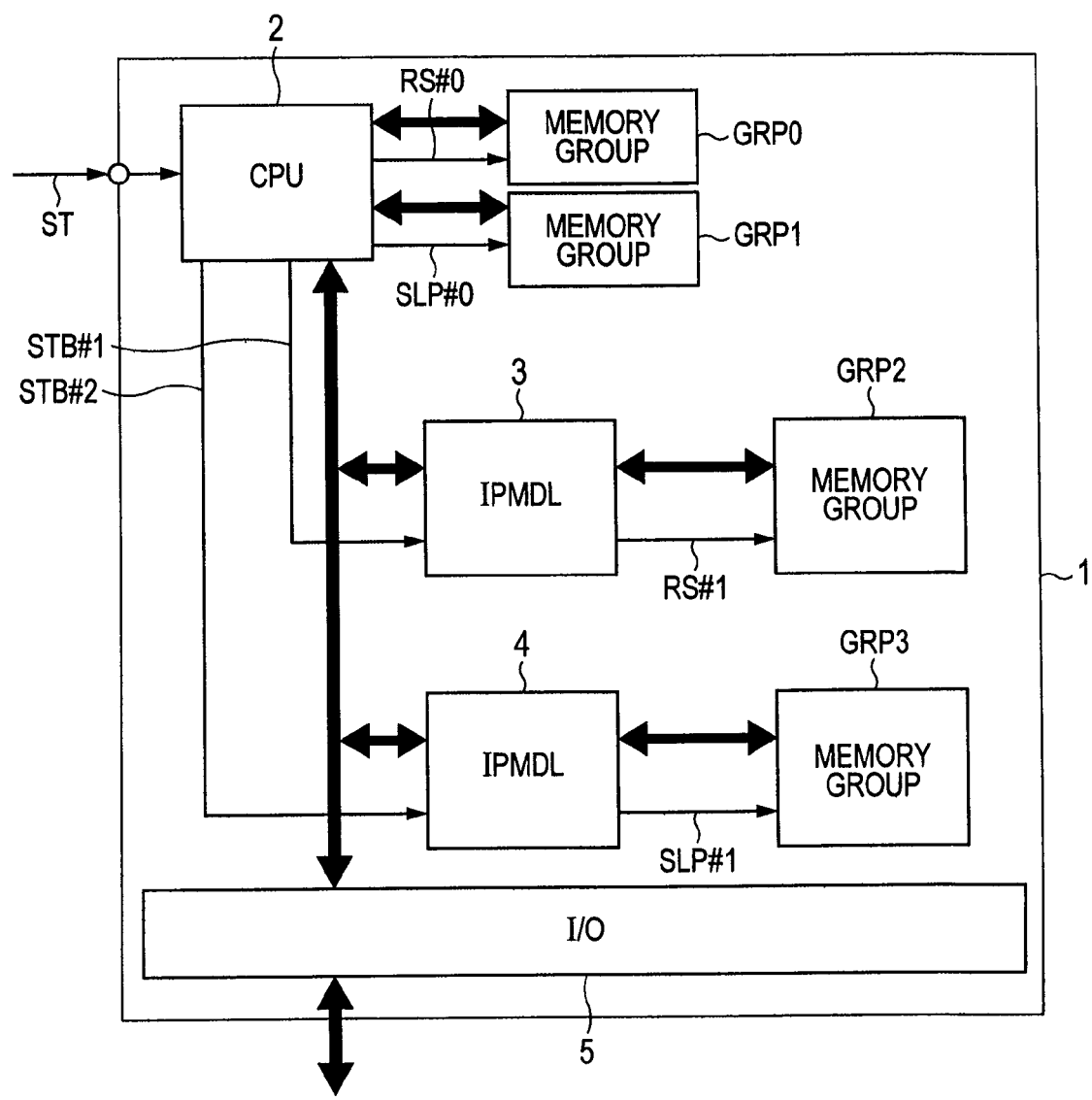
FIG. 15 is a block diagram illustrating a specific example of a microcomputer as an example of a semiconductor device.

FIG. 15 illustrates a microcomputer 1 as an example of a semiconductor device. The microcomputer 1 shown in this figure may be formed on a single semiconductor substrate such as a single-crystal silicon substrate by using CMOS integrated circuit production technology.

The microcomputer 1 includes a central processing unit (CPU) 2 that executes a command. The CPU 2 is coupled to memory groups GRP0 and GRP1 used by the CPU 2 as a work area or a program area. SRAM modules included in the memory groups GRP0 and GRP1 are mapped into an address space of the CPU 2. The CPU 2 is also coupled to logic circuit blocks IPMDL 3 and 4 including logic circuit modules serving as a peripheral circuit of the CPU 2 or an accelerator. The logic circuit blocks 3 and 4 may be, for example, a data processing module for image processing, a data processing module for communication processing, or data processing module for audio processing. The logic circuit blocks 3 and 4 are, by way of example, coupled to memory groups GRP2 and GRP3 used as work areas in local address spaces. Needless to say, SRAM modules included in the memory groups GRP2 and GRP3 are allocated in address spaces in the respective logic circuit blocks 3 and 4. In a particular operation mode, the SRAM modules may be directly accessible by the CPU 2. The CPU 2, the IPMDLs 3 and 4 are coupled to an external interface circuit (I/O) 5 via an internal bus 6.

The memory groups GRP0 to GRP3 each include memory blocks including SRAM modules as described above with reference to FIG. 1. In FIG. 15, for convenience of illustration, the memory groups GRP0 to GRP3 are illustrated as perfectly independent of and isolated from the CPU 2 and the logic circuit blocks IPMDL 3 and 4. However, practically, the SRAM modules included in the memory groups GRP0 to GRP3 form registers, FIFO buffers, work memories, etc., located close to the CPU 2 and the logic circuit blocks IPMDL 3 and 4.

The CPU 2 outputs a resume standby signal RS #0 to control the memory group GRP0 and also outputs an electric power shut-off SLP #0 to control the memory group GRP1. The electric power shut-off SLP #0 for controlling the memory group GRP1 is used instead of the resume standby signal. In this case, when the electric power shut-off SLP #0 indicating that the SRAM modules should enter a power supply shut-off mode is issued, electric power to all circuits may be shut off. It is not necessary to configure the SRAM module and associated circuit such that the information stored in the static memory cells of the memory array is held in the shut-off state.

The logic circuit block 3 outputs a resume standby signal RS #1 to controls the memory group GRP2, and the logic circuit block 4 outputs an electric power shut-off SLP #1 to control the memory group GRP3. The electric power shut-off SLP #0 for controlling the memory group GRP3 is a signal used instead of the resume standby signal. In this case, when the electric power shut-off SLP #1 indicating that the SRAM modules should enter a power supply shut-off mode is issued, electric power to all circuits may be shut off. It is not necessary to configure the SRAM module and associated circuit such that the information stored in the static memory cells of the memory array is held in the shut-off state.

When the standby signal STB #1 outputted from the CPU 2 is asserted high, the logic circuit block 3 asserts the resume standby signal RS #1 to the high level. Similarly, when the standby signal STB #2 outputted from the CPU 2 is asserted high, the logic circuit block 4 asserts the electric power shut-off SLP #1 to the high level.

For example, if a standby mode signal ST supplied from the outside of the microcomputer 1 is asserted, then, in response, the CPU 2 performs an interrupt process to execute the standby command. More specifically, the CPU 2 asserts the resume standby signals RS #0 and RS #1 and the electric power shut-off signals SLP #0 and SLP #1 thereby setting the whole the microcomputer 1 in the lower power consumption state. When the CPU 2 executes a particular standby command in accordance with a program, the CPU 2 may set particular one or more of the memory groups GRP0 to GRP3 specified by an operand of the command into the resume standby state or the power shut-off state. When the logic circuit block 3 or 4 performs data processing in response to a command from the CPU 2, the logic circuit block 3 or 4 may force the memory group GRP2 (or GRP3) to exit the resume standby state (power shut-off state). When the specified data processing is complete, the logic circuit block 3 or 4 may set the memory group GRP2 (or GRP3) into the resume standby state (power shut-off state).

FIG. 16 illustrates, by way of example, operating timings associated with the microcomputer shown in FIG. 15. As shown in FIG. 16, it is possible to finely control the lower power consumption state of the microcomputer 1 in accordance with a resume standby command or a power shut-off command from the CPU 2, or the logic circuit block 3 or 4.

In the place and route design of the microcomputer 1, a determination is made as to which SRAM module is to be placed in which memory block, as to which memory block is to be placed in which memory group, as to the memory module coupling path in each memory block, and as to the coupling path among memory blocks. The outline of the determination procedure is as follows.

1. Memory groups are determined by grouping SRAM modules at close physical locations such that the total storage capacity of each memory group is equal to or less than a predetermined value.
2. A memory module with a large storage capacity is selected from each memory group.
3. The memory modules selected in the respective memory groups are coupled in series in the form of chain such that the output node RSO of an upstream memory module is coupled to the input node RSI of a downstream memory module.

Although the present invention has been described with reference to specific embodiments, the present invention is not limited to those described above. It should be understood that various changes, substitutions and alterations can be made without departing from the spirit and scope of the invention.

In the embodiments described above, the storage capacity is employed as the criterion for making the determination as to which SRAM modules are employed as SRAM modules via which to transmit the module standby signals inputted from upstream modules to downstream modules via inside-of-module paths. However, the determination may be made based on other criteria as described by way of example below.

In a first example, the smallest storage capacity of each memory module (for example, SRAM module) is employed as the criterion. More specifically, a memory module with a storage capacity greater than the smallest storage capacity in a memory block of interest is selected as a memory module via which the module standby signal is transferred as the control signal such that the module standby signal is outputted from an inside-of-module path in the memory module to a downstream outside-of-module path.

In a second example, a relationship between inside-of-module paths and the number of memory cells is employed as the criterion. More specifically, a memory module having a greater number of memory cells arranged along an inside-of-module path than other memory modules have is selected from the memory modules belonging to the same memory blocks, and the selected memory module is employed as a memory module via which the module standby signal is transferred as the control signal such that the module standby signal is outputted from an inside-of-module path in the memory module to a downstream outside-of-module path. This determination criterion may be employed when the determination should not be made only based on the apparent storage capacity. For example, in a case where the number of memory cells arranged in the direction in which word lines extend is much greater than the number of memory cells arranged in the direction in which bit lines extend (i.e., when the memory cell array has a rectangular shape whose vertical or horizontal side is much greater than the other), the inside-of-module path should be formed such that it extends along the word lines to achieve a greater propagation delay in the transmission of the module standby signal serving as the control signal thereby allowing it transfer the module standby signal to the downstream memory block so as to adapt to a slow speed at which the low power consumption mode is exited along the word lines.

In a third example, relative storage capacities of two arbitrary memory modules (first and second memory modules) in a memory block are taken as criterion. More specifically, arbitrary two memory modules in a memory block are compared in terms of their storage capacity without taking into account other memory modules in the memory block, and a memory module having a greater storage capacity than the other has is employed as a memory module through which the module standby signal is transferred such that the module standby signal is outputted from an inside-of-module path to a downstream outside-of-module path.

In a fourth example, a relationship between two arbitrary memory modules (first and second memory modules) in a memory block in terms of the inside-of-module path and the number of memory cells is taken into consideration. That is, in this case, a mixture of criteria in the second example and the third example is employed. More specially, two arbitrary memory modules in a memory block are selected without taking into account the storage capacities of the other memory modules in the memory block, a memory module having a greater number of memory cells arranged along an inside-of-module path than other memory modules have is selected from the memory modules belonging to the same memory blocks, and the selected memory module is employed as a memory module via which the module standby signal is transferred as the module standby signal such that the module standby signal is outputted from an inside-of-module path in the memory module to a downstream outside-of-module path.

The type of memory modules is not limited to the SRAM type. For example, DRAM type, flush memory type, or other any memory type may be employed. Furthermore, memory blocks may include memory modules of different types such as the SRAM type and the flush memory type.

In the embodiments described above, the lower power consumption control signal is outputted from the output node of a memory module that is the greatest of all memory modules belonging to the same memory block. However, the selection of the memory module may be made in a different manner. For example, in a case where overlapping of current peak among memory blocks is allowed to a certain degree, or in a case where a large delay caused by use of a large memory module results in a problem, then not the greatest memory module in the memory block but a smaller memory module may be selected. For example, a memory module having an average storage capacity in the memory block may be selected. The selection should be made such that at least the memory module having the smallest storage capacity is not selected.

The reason for selecting memory modules based on the storage capacity is that the current that flows in the memory array when the lower power consumption state is cancelled increases as the storage capacity increases, and the inrush current peak also increases correspondingly. The propagation delay time of the low power consumption mode control signal along the inside-of-module path INRij is set so as to increase with the storage capacity, because when the inrush current peak is large, it is desirable to increase the interval between peaks to avoid the overlapping of peaks. As described above, when the memory array has a greater size in the direction along the word lines than in the other direction, it is advantageous to form the inside-of-module path INRij so as to extend in the direction along the word lines. On the other hand, when the memory array has a greater size in the direction along the bit lines than in the other direction, it is advantageous to form the inside-of-module path INRij so as to extend in the direction along the bit lines. When it is necessary to assume that the operation speed is different among memory modules, in addition to the assumption that the propagation delay time of the low power consumption mode control signal along the inside-of-module path INRij is set so as to increase with the storage capacity, a series of transmission paths of the low power consumption mode control signal may be determined not based on the storage capacity but based on the propagation delay time along the inside-of-module path INRij.

The storage capacity of the memory module may be defined in various manners. For example, it may be defined by the total number of memory cells, the number of memory cells per memory cell row in the memory cell array, the number of memory cell rows in the memory cell array, the number of memory cells per memory cell column in the memory cell array, or the number of memory cell columns. The storage capacity may also be defined by the area size occupied on the chip by the memory module, the vertical or horizontal length of the rectangular of the memory module, etc.

Techniques disclosed in the respective embodiments may be combined together.

The semiconductor device according to the present invention may be applied not only to the microcomputer, but also to other wide variety of apparatuses such as data processing devices, memory devices, etc., having memory modules such as SRAM modules.

What is claimed is:

1. A semiconductor device comprising:
a central processing unit that executes a command;
a memory disposed in a memory space of the central processing unit and coupled to receive a control signal from the central processing unit, the memory including:
 a first memory module,
 a second memory module,
 a third memory module, and
 a fourth memory module,
 each of the memory modules having a memory cell array including memory cells and a peripheral circuit that performs reading and writing of data to or from the memory cells,
 each of the memory modules having a standby mode to consume less electric power than in a normal operation mode in which reading or writing to or from the memory cells is performed;
 a first control signal line coupled to the first memory module and the second memory module to transmit the control signal for controlling the normal operation mode and the standby mode in parallel to the first memory module and the second memory module;
 a second control signal line coupled to the third memory module and the fourth memory module to transmit the control signal to the third memory module and the fourth memory module via the first memory module; and
 a first wiring disposed in the first memory module and coupled between the first control signal line and the second control signal line to transmit the control signal from the first control signal line to the second control signal line via the first wiring,
 wherein the first memory module has a greater number of memory cells than the second memory module.

2. The semiconductor device according to claim 1, wherein the first wiring disposed between the first control signal line and the second control signal line is coupled to a transistor that controls electric power to the peripheral circuit of the first memory module.

3. The semiconductor device according to claim 1, wherein the first wiring disposed between the first control signal line and the second control signal line is coupled to a transistor that controls electric power to the memory cells in the first memory module.

4. The semiconductor device according to claim 3, wherein the first wiring is disposed along the memory cell array in the first memory module.

5. A semiconductor device comprising:
a central processing unit that executes a command;
an accelerator that performs data processing according to an instruction from the central processing unit; and
a memory disposed in a local memory space of the accelerator and coupled to receive a control signal from the accelerator, the memory including:
 a first memory module,
 a second memory module,
 a third memory module, and
 a fourth memory module,
 each of the memory modules having a memory cell array including memory cells and a peripheral circuit that performs reading and writing of data to or from the memory cells,
 each of the memory modules having a standby mode to consume less electric power than in a normal operation mode in which reading or writing to or from the memory cells is performed;
 a first control signal line coupled to the first memory module and the second memory module to transmit the control signal for controlling the normal operation mode and the standby mode in parallel to the first memory module and the second memory module;
 a second control signal line coupled to the third memory module and the fourth memory module to transmit the control signal to the third memory module and the fourth memory module via the first memory module; and
 a first wiring disposed in the first memory module coupled between the first control signal line and the second control signal line to transmit the control signal from the first control signal line to the second control signal line via the first wiring, wherein the first memory module has a greater number of memory cells than the second memory module.

6. The semiconductor device according to claim 5, wherein the first wiring disposed between the first control signal line and the second control signal line is coupled to a transistor that controls electric power to the peripheral circuit of the first memory module.

7. The semiconductor device according to claim 5, wherein the first wiring disposed between the first control signal line and the second control signal line is coupled to a transistor that controls electric power to the memory cells in the first memory module.

8. The semiconductor device according to claim 7, wherein the first wiring is disposed along the memory cell array in the first memory module.

9. A semiconductor device comprising:
a central processing unit that executes a command; and
a memory disposed in a memory space of the central processing unit and coupled to receive a control signal from the central processing unit, the memory including:
memory modules each having a memory cell array including a plurality of memory cells and a peripheral circuit that performs reading and writing of data to or from the memory cells, each of the memory modules having a standby mode to consume less electric power than in a normal operation mode in which reading or writing to or from the memory cells is performed, the memory modules including a first memory module, a second memory module, and a third memory module;
a first control signal line coupled to the first memory module and the second memory module to transmit the control signal for controlling the normal operation mode and the standby mode to the first memory module and the second memory module;
a second control signal line coupled to the third memory module to transmit the control signal to the third memory module via the first control signal line and the first memory module;
a first wiring member extending along the memory cell array of the first memory module and coupled to a first transistor of the first memory module and also coupled between the first and second control signal lines; and
a second wiring member extending along the memory cell array of the second memory module and coupled to a second transistor of the second memory module,
wherein a number of memory cells disposed along the first wiring member in the memory cell array in the first memory module is greater than that of the memory cells disposed along the second wiring member in the memory cell array in the second memory module.

10. The semiconductor device according to claim 9, wherein the first transistor is a transistor that controls electric power to the peripheral circuit in the first memory module.

11. The semiconductor device according to claim 10, wherein the second transistor is a transistor that controls electric power to the memory cells in the second memory module.

12. A semiconductor device comprising:
a first memory module;
a second memory module; and
a third memory module,
each of the memory modules having a memory cell array including a plurality of memory cells and a peripheral circuit for reading data from the memory cells,
each of the memory modules having a first state to consume less electric power than in a second state, and the first memory module having a greater storage capacity than a storage capacity of the second memory module;
a first control signal line coupled in parallel with the first memory module and the second memory module to transmit a control signal for controlling the first state and the second state to the first memory module and the second memory module;
a second control signal line coupled with the first memory module and the third memory module to transmit the control signal from the first memory module to the third memory module; and
a first wiring disposed in the first memory module and coupled between the first control signal line and the second control signal line for transmitting the control signal from the first control signal line to the second control signal line via the first wiring.

13. The semiconductor device according to claim 12, wherein the first, second, and third memory modules have a word line and complementary bit lines coupled with each of the memory cells, and
wherein each of the memory cells is a static type memory cell.

14. The semiconductor device according to claim 13, wherein the peripheral circuit is a sense amplifier coupled with the complementary bit lines.

15. The semiconductor device according to claim 14, wherein the first state is a standby mode in which supplying of the power supply voltage to the memory modules is shut off while maintaining the information stored in the memory cells, or a power supply shut-off mode in which electric power to the memory modules is shut off without maintaining the information in the memory cells, and
wherein the second state is a normal operation mode in which reading or writing from or to the memory cells is performed.

16. The semiconductor device according to claim 15, wherein the first wiring is coupled with a first MOS transistor for controlling electric power to the sense amplifier of the first memory module.

17. The semiconductor device according to claim 15, wherein the first wiring is coupled with a second MOS transistor for controlling the electric power to the memory cells of the first memory module.

18. A semiconductor device comprising:
a first memory module,
a second memory module and
a third memory module,
each of the memory modules having a memory cell array including a plurality of memory cells, and having a first mode and a second mode set by a control signal;
a first control signal line coupled in parallel with the first memory module and the second memory module to transmit the control signal to the first and second memory modules;
a second control signal line coupled with the third memory module and the first wiring of the first memory module to transmit the control signal to the third memory module; and
a first wiring disposed in the first memory module and between the first control signal line and the second control signal line to transmit the control signal from the first control signal line to the second control signal line via the first wiring,
wherein in the first mode the memory modules consume less electric power than in the second mode, and wherein the first memory module having a greater storage capacity than the second memory module.

19. The semiconductor device according to claim 18, wherein the first wiring is coupled with a gate electrode of a first transistor in the first memory module.

20. The semiconductor device according to claim 19, wherein the first, second, and third memory modules have word line and complementary bit lines coupled with each of the memory cells, and
wherein each of the memory cells is a static type memory cell.

21. The semiconductor device according to claim 20, wherein the second mode is a normal operation mode in which reading or writing to or from the memory cells is performed.

22. The semiconductor device according to claim 21, wherein the first mode is a standby mode in which supplying of the power supply voltage to the memory modules is shut off while maintaining the information stored in the memory cells of the memory modules, or a power supply shut-off mode in which electric power to the memory modules is shut off without maintaining the information in the memory cells of the memory modules.

23. The semiconductor device according to claim 20, further comprising:
a central processing unit that outputs the control signal to the first and second memory modules via the first control signal line.

24. The semiconductor device according to claim 20, wherein the first transistor is for controlling electric power to a peripheral circuit that performs reading and writing data to or from the memory cells of the first memory module.

25. The semiconductor device according to claim 20, wherein the first transistor is for controlling electric power to the memory cells of the first memory module.

26. The semiconductor device according to claim 20, wherein the complementary bit lines are coupled with a sense amplifier that detects a potential difference between the complementary bit lines and amplifies the detected potential difference,
wherein the sense amplifier is coupled with a second transistor for controlling an operation of the sense amplifier, and
wherein a gate electrode of the second transistor is coupled with the first transistor.

27. The semiconductor device according to claim 26, wherein the first wiring is coupled with a series of first and second inverters.

* * * * *